(12) United States Patent
Priddy et al.

(10) Patent No.: US 9,187,821 B2
(45) Date of Patent: Nov. 17, 2015

(54) VACUUM DEPOSITION SOURCES HAVING HEATED EFFUSION ORIFICES

(75) Inventors: Scott Wayne Priddy, Saint Louis Park, MN (US); Richard Charles Bresnahan, Cottage Grove, MN (US)

(73) Assignee: Veeco Instruments Inc., Plainview, NY (US)

( * ) Notice: Subject to any disclaimer, the term of this patent is extended or adjusted under 35 U.S.C. 154(b) by 631 days.

(21) Appl. No.: 12/539,443

(22) Filed: Aug. 11, 2009

(65) Prior Publication Data

US 2010/0031878 A1    Feb. 11, 2010

Related U.S. Application Data

(60) Provisional application No. 61/188,671, filed on Aug. 11, 2008.

(51) Int. Cl.
| C23C 16/00 | (2006.01) |
| C23C 14/24 | (2006.01) |
| C23C 14/06 | (2006.01) |

(52) U.S. Cl.
CPC .......... C23C 14/243 (2013.01); C23C 14/0623 (2013.01)

(58) Field of Classification Search
CPC .................................................... C23C 14/246
USPC ................................................ 118/726, 727
See application file for complete search history.

(56) References Cited

U.S. PATENT DOCUMENTS

| 3,404,061 A | * | 10/1968 | Bochman et al. | ............. 428/143 |
| 4,073,338 A | * | 2/1978 | Fujikake et al. | ................ 165/86 |
| 4,550,411 A | * | 10/1985 | Stonestreet et al. | .......... 373/134 |
| 4,564,158 A | * | 1/1986 | Moosberg et al. | ............. 242/261 |
| 4,787,333 A | * | 11/1988 | Kamino et al. | ................ 118/726 |
| 5,158,750 A | * | 10/1992 | Finicle | .......................... 422/547 |
| 5,558,720 A | | 9/1996 | Sarraf et al. | |
| 5,820,681 A | | 10/1998 | Colombo et al. | |
| 5,827,371 A | | 10/1998 | Colombo et al. | |
| 5,932,294 A | | 8/1999 | Colombo et al. | |
| 6,011,904 A | * | 1/2000 | Mattord | ........................ 392/389 |
| 6,063,201 A | | 5/2000 | Lee et al. | |
| 6,162,300 A | | 12/2000 | Bichrt | |
| 6,689,992 B1 | | 2/2004 | Ramos et al. | |
| 2004/0200416 A1 | * | 10/2004 | Schuler et al. | ............. 118/723 E |
| 2005/0034671 A1 | * | 2/2005 | Ohara | ........................... 118/726 |

(Continued)

FOREIGN PATENT DOCUMENTS

| EP | 0 122 088 | 10/1984 |
| EP | 1 732 129 | 8/2007 |

(Continued)

OTHER PUBLICATIONS

Priddy, U.S. Appl. No. 12/539,458, filed Aug. 11, 2009.

*Primary Examiner* — Keath Chen
(74) *Attorney, Agent, or Firm* — Kagan Binder, PLLC

(57) ABSTRACT

The present invention provides deposition sources that can efficiently and controllably provide vaporized material for deposition of thin film materials. Deposition sources described herein can be used to deposit any desired material and are particularly useful for depositing high melting point materials at high evaporation rates. An exemplary application for deposition sources of the present invention is deposition of copper, indium, and gallium in the manufacture of copper indium gallium diselenide based photovoltaic devices.

21 Claims, 20 Drawing Sheets

(56) References Cited

U.S. PATENT DOCUMENTS

| | | |
|---|---|---|
| 2006/0204648 A1* | 9/2006 | Lee et al. .......................... 427/8 |
| 2007/0077821 A1 | 4/2007 | Pilavdzic |
| 2007/0087130 A1* | 4/2007 | Arai ............................. 427/457 |
| 2008/0173241 A1 | 7/2008 | Priddy et al. |
| 2010/0218723 A1 | 9/2010 | Yamamoto et al. |

FOREIGN PATENT DOCUMENTS

| | | |
|---|---|---|
| JP | 9-228032 | 9/1997 |
| JP | 9-287070 | 11/1997 |
| JP | 8-024998 | 2/2008 |
| WO | WO 01/98054 | 12/2001 |
| WO | WO 2005/109963 | 11/2005 |

* cited by examiner

VACUUM DEPOSITION SOURCES HAVING HEATED EFFUSION ORIFICES

CROSS REFERENCE TO RELATED APPLICATIONS

This application claims the benefit of U.S. Provisional Application Ser. No. 61/188,671 filed Aug. 11, 2008 entitled HIGH TEMPERATURE DEPOSITION SOURCES AND METHODS, which is hereby incorporated by reference in its entirety for all purposes.

TECHNICAL FIELD

The present invention is directed to vacuum deposition sources. In particular, the present invention is directed to vacuum deposition sources having heated effusion orifices that help to prevent deposition material from accumulating near such effusion orifices and restricting flow of deposition material. A preferred exemplary deposition source in accordance with the present invention comprises a rear-loading crucible and a conical heat shield assembly comprising a conical cover positioned relative to effusion orifice end of the crucible. Vacuum deposition sources in accordance with the present invention can be used in vacuum environments in the millitorr range as well as vacuum environments suitable for ultra-high vacuum applications such molecular beam epitaxy.

BACKGROUND

Compounds of copper indium diselenide (CIS) with gallium substituted for all or part of the indium (copper indium gallium diselenide or CIGS) are used in photovoltaic devices. For example, CIGS provides absorber layers in thin-film solar cells. CIGS semiconductor materials have a direct band gap that permits strong absorption of solar radiation in the visible range. CIGS cells have demonstrated high efficiencies and good stability as compared to other absorber layer compounds such as cadmium telluride (CdTe) or amorphous silicon (a-Si).

Solar cell devices typically include a substrate, a barrier layer, a back contact layer, a semiconductor layer, alkali materials, an n-type junction buffer layer, an intrinsic transparent oxide layer, and a conducting transparent oxide layer. In a device that utilizes CIGS, the semiconductor layer includes copper, indium, gallium, and selenium. The CIGS layers used for photovoltaic conversion need to have a p-type semiconductor character and good charge transport properties. These charge transport properties are favored by good crystallinity. The CIGS thus need to be at least partially crystallized in order to have sufficient photovoltaic properties for use in the fabrication of solar cells. Crystallized CIGS compounds have a crystallographic structure corresponding to the chalcopyrite or sphalerite systems, generally depending on the deposition temperature.

CIGS thin films can be deposited by various techniques, typically vacuum based. One technique involves the use of precursors. In this technique, intermediate compounds are used and have physicochemical properties that are distinct from those of CIGS and make them incapable of photovoltaic conversion. The precursors are initially deposited in a thin film form, and the thin film is subsequently processed to form the intended CIGS layer. When precursor materials are deposited at a low temperature, the resulting CIGS thin films are weakly crystallized or amorphous. These thin films need to be annealed by supplying heat to improve the crystallization of the CIGS and provide satisfactory charge transport properties. At the temperatures that allow at least partial crystallization of the CIGS, however, one of the constituent elements of the CIGS (selenium) is more volatile than the other elements. It is therefore difficult to obtain crystallized CIGS with the intended composition and stoichiometry without adding selenium during annealing of the precursor layer. Time consuming annealing of the precursor deposits in the presence of selenium excess in the vapor phase is thus needed to form suitable material.

Another technique for depositing CIGS thin films involves vacuum evaporation. Devices formed by this technique often have high photovoltaic conversion efficiencies compared to techniques that use precursor materials. Typically, co-evaporation of the copper, indium, gallium, and selenium is performed in the presence of a substrate. This co-evaporation technique has an advantage in that the content of gallium in the thin film light-absorbing layer can be regulated to achieve the optimum bandgap. Evaporation is a technique that can be difficult to use on the industrial scale, however, particularly because of non-uniformity problems with the thin film deposits over large surface areas and a low efficiency of using the primary materials.

There are additional challenges that arise when using vacuum deposition techniques for depositing CIGS thin films. For example, selenium reacts aggressively with many materials that are typically used in the manufacture of vacuum deposition sources especially at elevated temperatures. Accordingly, the materials and the mechanical design of deposition sources used in a selenium environment are carefully considered.

Additionally, undesirable accumulation of deposition material in the vicinity of the effusion orifice of a vacuum deposition sources can occur under certain deposition conditions. Typically, such deposition conditions include one or more of high deposition temperatures and high deposition rates such as those used for deposition of high temperature metals or semiconductors materials, such as copper, for example. Continued accumulation of deposition material can reduce the area of the effusion orifice and thereby reduce the deposition rate. Ultimately, continued accumulation of deposition material can effectively close the effusion orifice so the deposition rate is unacceptably low or non-existent.

SUMMARY

The present invention provides deposition sources that can efficiently and controllably provide vaporized material for deposition of thin film materials without the above-described problem related to accumulation of deposition material at the effusion orifice. Moreover, deposition sources in accordance with the present invention are particularly useful for use in a corrosive high temperature environment such as in the presence of selenium vapor. Deposition sources described herein can be used to deposit any desired materials, however, and are particularly useful for depositing materials at high evaporation rates (in excess of 30 grams per hour, for example) and at high temperatures (up to 1500° C., for example). An exemplary application for deposition sources of the present invention is deposition of copper, indium, and gallium in the manufacture of copper indium gallium diselenide based photovoltaic devices.

Deposition sources in accordance with the present invention preferably use a heater made from layers of pyrolytic boron nitride and pyrolytic graphite wherein the pyrolytic graphite functions as the resistive element and is sandwiched between layers of pyrolytic boron nitride. Because the resistive element is effectively encapsulated in pyrolytic boron nitride the resistive element is protected from the surrounding environment. Moreover, the heater is preferably designed so the heater is closely coupled with the crucible, which can help to keep the region near the effusion orifice of the crucible hot enough to prevent undesirable condensation of deposition material near the effusion orifice. Deposition sources in accordance with the present invention also preferably include a conical cover that prevents any material that falls back to the source from creating a seed that could cause deposition material to accumulate near the effusion orifice of the deposition source.

In an exemplary aspect of the present invention a vacuum deposition source is provided. The vacuum deposition source preferably comprises: a base flange configured to mount the vacuum deposition source to a vacuum chamber; a crucible operatively supported relative to the base flange and configured to hold vacuum deposition material, the crucible comprising a cylindrical body portion, a conical portion, and an effusion orifice; and a heater operatively supported relative to the base flange and at least partially surrounding the crucible, the heater comprising a cylindrical body portion configured and positioned to provide thermal radiation to at least a portion of the cylindrical body portion of the crucible and a conical portion configured and positioned to provide thermal radiation to at least a portion of the conical portion of the crucible, the heater comprising a layered structure comprising a pyrolytic graphite electrically resistive layer positioned between pyrolytic boron nitride electrically insulative layers.

In another exemplary aspect of the present invention a vacuum deposition source is provided. The vacuum deposition source preferably comprises: a base flange configured to mount the vacuum deposition source to a vacuum chamber; a crucible operatively supported relative to the base flange and configured to hold vacuum deposition material, the crucible comprising a cylindrical body portion, a conical portion, and an effusion orifice; a heater operatively supported relative to the base flange and at least partially surrounding the crucible, the heater comprising a cylindrical body portion configured and positioned to provide thermal radiation to at least a portion of the cylindrical body portion of the crucible and a conical portion configured and positioned to provide thermal radiation to at least a portion of the conical portion of the crucible, the heater comprising a layered structure comprising a pyrolytic graphite electrically resistive layer positioned between pyrolytic boron nitride electrically insulative layers; a liquid cooling enclosure operatively attached to the base flange at a first end of the liquid cooling enclosure and at least partially surrounding the crucible; and a conical cover positioned at a second end of the liquid cooling enclosure opposite the first end of the cooling enclosure, the conical cover comprising an opening positioned relative to the effusion orifice of the crucible.

In yet another exemplary aspect of the present invention a vacuum deposition source is provided. The vacuum deposition source preferably comprises: a base flange configured to mount the vacuum deposition source to a vacuum chamber; a crucible support assembly comprising a support flange removably mounted to the base flange and a crucible support cup supported relative to the support flange; a crucible operatively supported by the support cup of the crucible support assembly and configured to hold vacuum deposition material, the crucible comprising a cylindrical body portion, a conical portion, and an effusion orifice; and a heater operatively supported relative to the base flange and at least partially surrounding the crucible, the heater comprising a cylindrical body portion configured and positioned to provide thermal radiation to at least a portion of the cylindrical body portion of the crucible and a conical portion configured and positioned to provide thermal radiation to at least a portion of the conical portion of the crucible, the heater comprising a layered structure comprising a pyrolytic graphite electrically resistive layer positioned between pyrolytic boron nitride electrically insulative layers.

BRIEF DESCRIPTION OF THE DRAWINGS

The accompanying drawings, which are incorporated in and constitute a part of this disclosure, illustrate several aspects of the present invention and together with description of the exemplary embodiments serve to explain the principles of the present invention. A brief description of the drawings is as follows.

DETAILED DESCRIPTION

Figure 1:
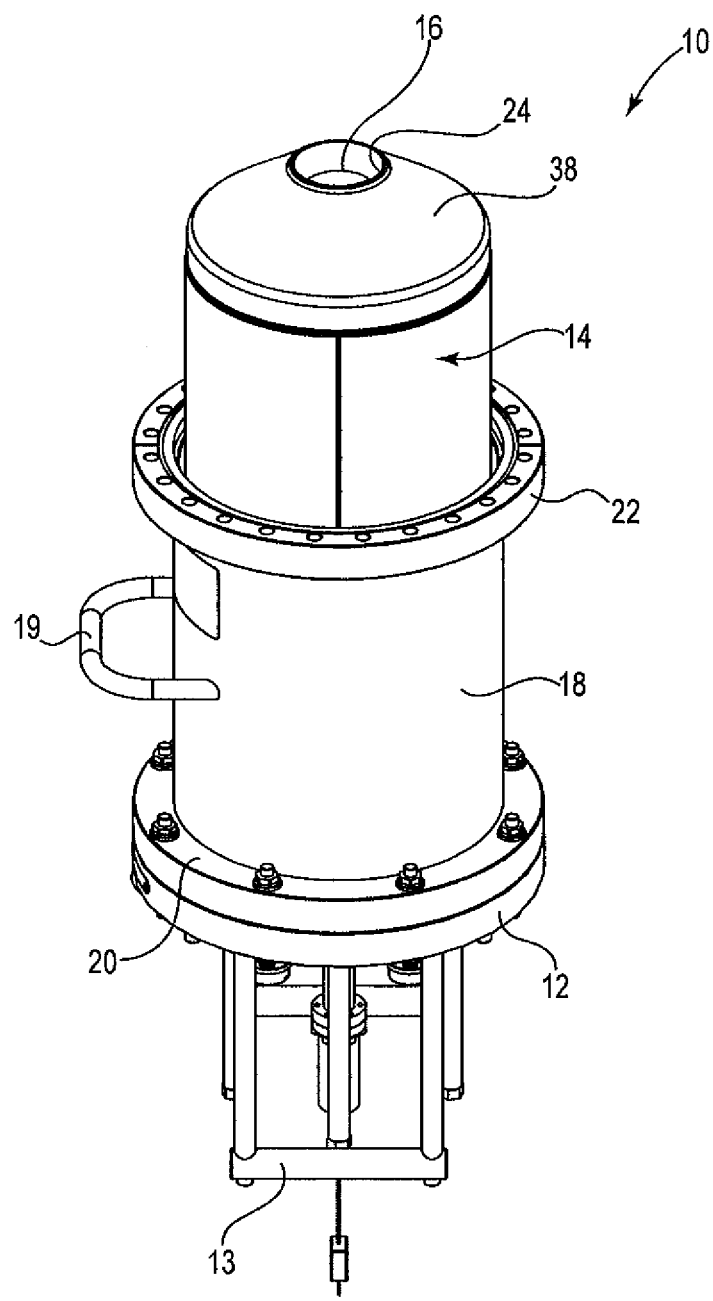
FIG. 1 is a perspective view of an exemplary deposition source in accordance with the present invention and showing in particular a conical heat shield assembly comprising a conical cover.

The exemplary embodiments of the present invention described herein are not intended to be exhaustive or to limit the present invention to the precise forms disclosed in the following detailed description. Rather the exemplary embodiments described herein are chosen and described so those skilled in the art can appreciate and understand the principles and practices of the present invention. Structural aspects of the present invention that are illustrated and described are exemplary and alternative structures that provide the desired functionality will be apparent to those of skill in the art and can be used in accordance with the present invention.

An exemplary vacuum deposition source 10 in accordance with the present invention is illustrated in FIGS. 1 through 17. In an exemplary application vacuum deposition source 10 is used to provide efficient deposition of copper, indium, and gallium for forming CIGS based photovoltaic devices such as those used in solar cells. In such application, one or more deposition sources 10 of the present invention are used with one or more selenium deposition sources in a vacuum deposition system (not shown) for deposition of such CIGS based materials. Preferably, when deposition sources in accordance with the present invention are used in a selenium environment materials used for construction of such deposition sources are selected accordingly. In particular, materials that are known to corrode when in the presence of selenium and high temperatures are preferably avoided when possible.

Deposition sources in accordance with the present invention are particularly useful in harsh vacuum environments such as those where corrosive materials such as selenium are used. It is contemplated, however, that deposition sources in accordance with the present invention can be used for deposition of any desired material in any desired vacuum environment including but not limited to metals, ceramics, semiconductors, and elemental materials, for example. Vacuum deposition sources in accordance with the present invention are also particularly useful in vacuum environments having a background pressure less than about 1 millitorr. Vacuum deposition sources in accordance with the present invention can also be used in vacuum environments having a background pressure in the high vacuum and ultrahigh vacuum regime such as those used in conventional thermal evaporation and molecular beam epitaxy, for example. When deposition sources in accordance with the present invention are used in an environment free from corrosive materials such as selenium, materials used for construction of such deposition sources are preferably selected in view of a particular operating environment in which a deposition source is to be used. When appropriate, conventional materials for construction of vacuum equipment are preferably used such as stainless steel, refractory metals, and pyrolytic boron nitride, for example.

Deposition sources in accordance with the present invention can be used for deposition on any desired substrates such as glass, semiconductor materials, and/or plastic materials, for example.

Referring initially to FIG. 1 exemplary vacuum deposition source 10 in accordance with the present invention is illustrated. Vacuum deposition source 10 includes base flange 12, deposition source body 14, and effusion orifice 16. Base flange 12 supports deposition body 14 and functions to attach deposition source 10 to a vacuum deposition system (not shown). Base flange 12 also preferably includes optional handles 13 as shown in the exemplary illustrated embodiment. As is common with vacuum deposition equipment, base flange 12 preferably comprises stainless steel.

As illustrated, deposition source 10 includes optional nipple 18 having flange 20 attached to base flange 12. Nipple 18 also include optional handle 19 as shown in the exemplary illustrated embodiment. Nipple 18 is typically used to adapt deposition source 10 to a particular vacuum deposition system (not shown). When nipple 18 is used, vacuum deposition source 10 is attached to a vacuum deposition system (not shown) with flange 22 of nipple 18. Stainless steel construction is preferably used for nipple 18.

Figure 2:
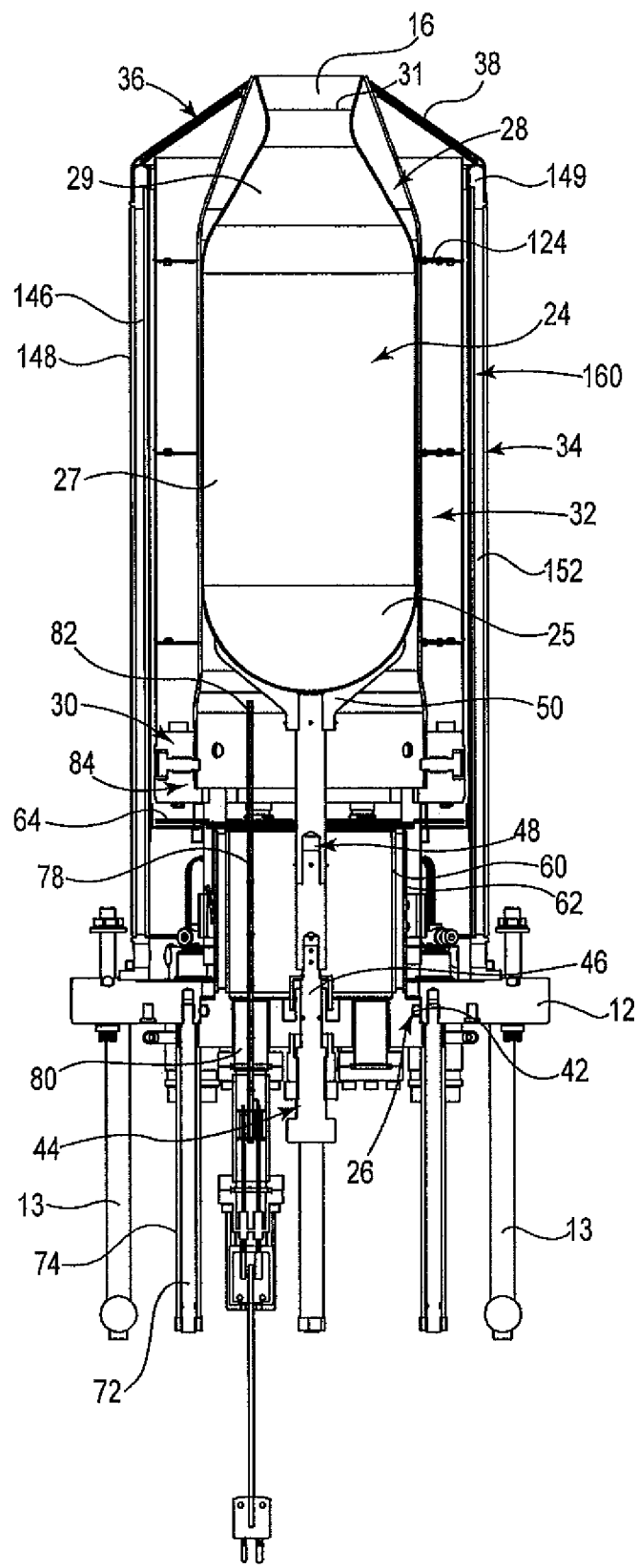
FIG. 2 is a cross-sectional view of the deposition source shown in FIG. 1 and showing in particular an exemplary liquid cooling enclosure in accordance with the present invention.

Referring to FIG. 2 generally, exemplary deposition source 10 preferably includes crucible 24, crucible support assembly 26, heater 28, heater support assembly 30, tubular heat shield assembly 32, liquid cooling enclosure 34, conical heat shield assembly 36, and conical cover 38.

Figure 3:
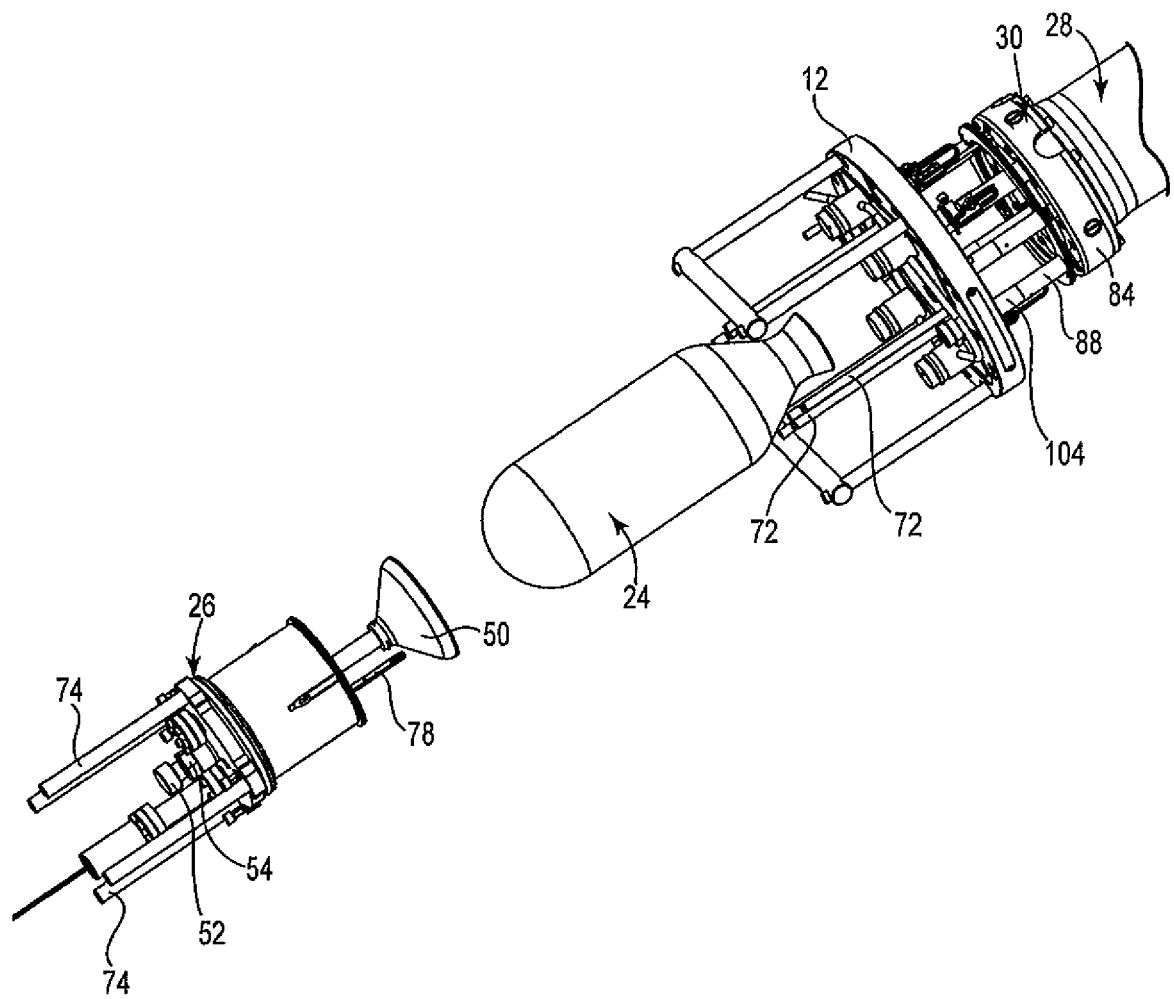
FIG. 3 is a partial exploded view of the deposition source shown in FIG. 1 and showing in particular an exemplary removable crucible support assembly in accordance with the present invention.
Figure 4:
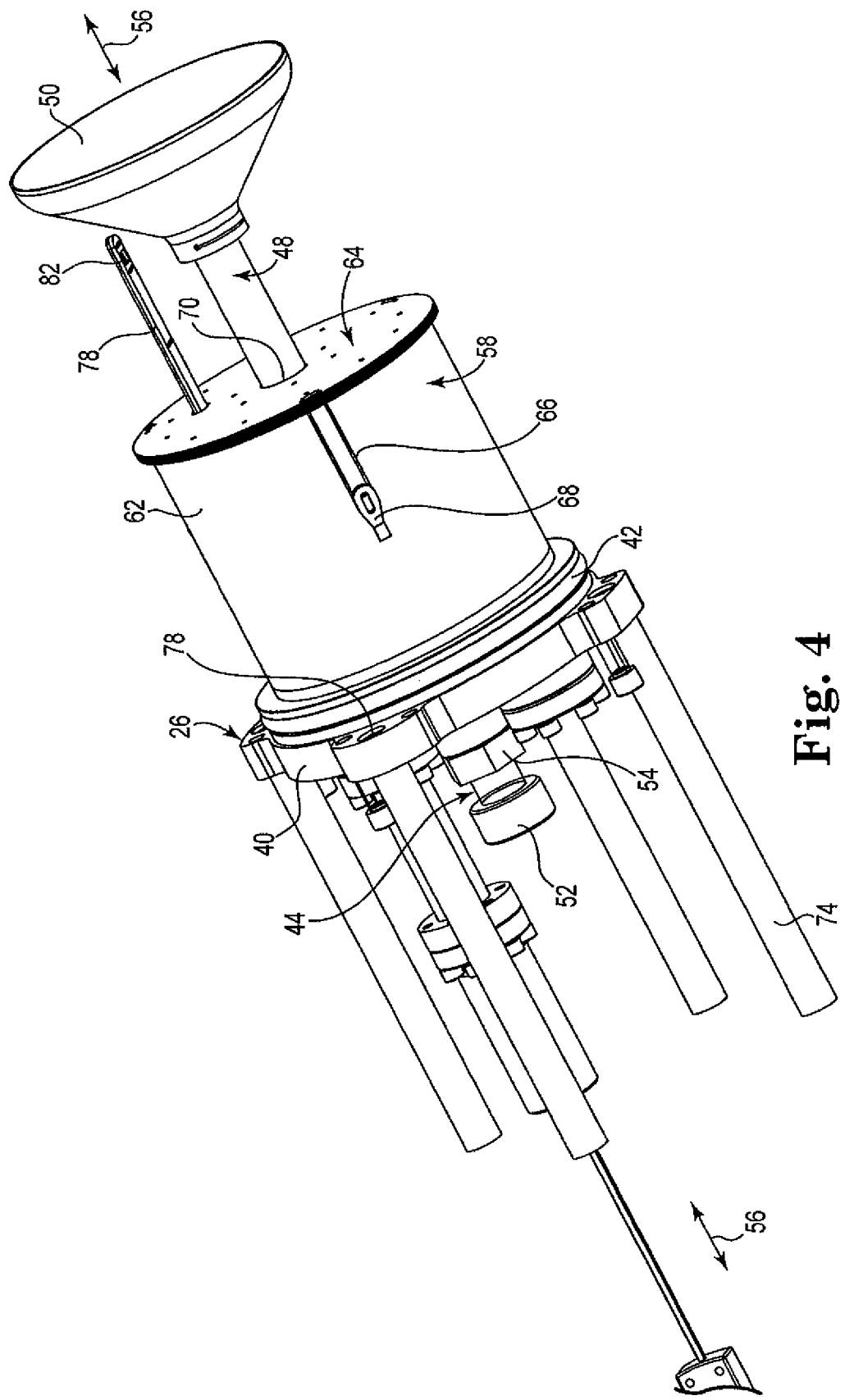
FIG. 4 is a perspective view of the removable crucible support assembly shown in FIG. 3 in accordance with the present invention.

Crucible 24 is removably and adjustably positioned relative to base flange 12 with crucible support assembly 26, which can be seen in more detail in FIGS. 3 and 4. Advantageously, crucible support assembly 26 allows crucible 24 to be removed from deposition source 10 through base flange 12 of deposition source 10. This rear loading capability allows for easier reloading of deposition material into crucible 24 because deposition source 10 does not need to be completely removed from the vacuum deposition system (not shown) as is needed for top loading deposition sources. Moreover, the rear loading design of deposition source 10 of the present invention allows greater flexibility in designing the effusion end of a deposition source because the crucible does not need to be removed from the effusion end of the deposition source and can be removed from the opposite end.

Crucible 24 preferably comprises a monolithic restricted-orifice vessel capable of holding a desired deposition material. As can be seen in FIGS. 2 and 3 crucible 24 comprises spherical end 25, cylindrical body portion 27, first conical portion 29, and second conical portion 31. An exemplary preferred crucible material is pyrolytic boron nitride, however, other materials can be used for crucible 24 as would be apparent to those of skill in the art. Pyrolytic boron nitride is a preferred material for vacuum deposition crucibles as well as for components used for vacuum deposition equipment. Pyrolytic boron nitride is generally inert, can withstand high temperatures, is generally clean and does not contribute undesirable impurities to the vacuum environment, is generally transparent to certain wavelengths of infrared radiation, and can be fabricated into complex shapes, for example.

Crucible material is preferably selected based on parameters such as material compatibility, operating temperature, thermal conductivity, and electrical conductivity, for example. Alternatives crucible materials that can be used include graphite, ceramics, and refractory metals, for example. Crucible 24 does not need to be monolithic and does not need to utilize the restricted-orifice design of exemplary crucibles 24. Crucible material and geometry is preferably selected based on factors such as the deposition material to be used in the environment in which the crucible will be located. Exemplary crucibles are described in U.S. Pat. No. 5,820,681, U.S. Pat. No. 5,827,371, and U.S. Pat. No. 5,932,294, the entire disclosures of which are incorporated by reference herein for all purposes. Crucibles that can be used with deposition sources in accordance with the present invention are available from Veeco Instruments, Inc. of St. Paul, Minn. and Momentive Performance Materials of Strongville, Ohio.

Referring to the perspective view of FIGS. 3 and 4 and the cross-sectional view of FIG. 2 crucible support assembly 26 includes support flange 40 that removably and sealingly mates to base flange 12 of deposition source 10. Support flange 40 preferably comprises stainless steel as is conventionally used for vacuum equipment. Preferably, as can be seen in FIG. 2 an o-ring seal 42 is used between support flange 40 and base flange 12. O-ring seals are preferred over metal gaskets when used in certain corrosive environments such as in the presence of selenium vapor, for example. Alternatively, depending on the application, a Conflat® style seal can be used, for example, which seal comprises flanges having knife-edges that embed into a soft metal seal gasket such as a copper or nickel gasket or the like. Appropriate sealing techniques for various vacuum applications are well known to those skilled in the art of vacuum equipment.

Further referring to FIGS. 2, 3, and 4, crucible support assembly 26 includes vacuum feed-through 44 that provides linear motion through support flange 40 from the ambient atmosphere side of support flange 40 to the vacuum side of support flange 40. Vacuum feed-through 44 preferably includes shaft 46 coupled to shaft assembly 48 and crucible support cup 50 attached to shaft assembly 48.

Shaft assembly 48 and crucible support cup 50 are preferably made from graphite while shaft 46 preferably comprises a dissimilar material such as titanium or stainless steel to provide a thermal break to help prevent heat from damaging feed-through 44, which preferably comprises an o-ring seal as noted below. Graphite is a preferred material because graphite provides a readily machinable material resistant to reaction with corrosive materials such as selenium and the like as well as deposition materials such as copper, indium, and gallium and is tolerant to the necessary process temperatures. Such processing temperatures, for example, can be as high as 1500° C. for some applications. Graphite also has thermal expansion properties compatible with pyrolytic boron nitride. Graphite is also relatively soft and thus provides a suitable support for crucibles made from pyrolytic boron nitride or other fragile or otherwise delicate materials. Graphite material is available from Poco Graphite, Inc. of Decatur, Tex., for example. A preferred graphite material is referred to as fine grain isostatically molded graphite.

Vacuum feed-through 44 also preferably includes adjustment knob 52 and lock nut 54. Rotation of adjustment knob 52 causes shaft 46, shaft assembly 48, and crucible support cup 50 to linearly translate along the direction indicated by reference numeral 56. Vacuum feed-through 44 preferably comprises a stainless steel shaft (shaft 46), threaded connection to provide linear motion, and an o-ring based vacuum seal. Vacuum feed-through 44 is exemplary and any device or mechanism that can provide linear motion of crucible support 50 along the direction indicated by reference to a 56 can be used. Such linear motion feed-through devices are well known to those skilled in the art of vacuum equipment.

Crucible support assembly 26 also includes liquid cooling enclosure 58 and heat shield assembly 60. Liquid cooling enclosure 58 and heat shield assembly 60 are preferably designed to shield vacuum feed-through 44 from direct radiant heat and help prevent o-ring seal of linear feed-through 44 from excess heat. Liquid cooling enclosure 58 and heat shield assembly 60 illustrate exemplary structure for providing such shielding and any desired structure that functions to help provide the desired cooling and heat shielding functionality can be used. As can be seen in FIG. 2, liquid cooling enclosure 58 preferably comprises inside wall 60 and outside wall 62 spaced apart from inside wall 60. Liquid cooling enclosure 58 is preferably welded to support flange 40 but other connection techniques such as those including use of removable fasteners can be used to attach liquid cooling enclosure 58 to support flange 40. Liquid cooling enclosure 58 preferably comprises stainless steel.

Heat shield assembly 64 preferably comprises plural layers of refractory metal sheets such as those made from tantalum, tungsten, niobium, and molybdenum, for example. Such refractory metal sheets may be flat, knurled, dimpled, or otherwise embossed to help space apart adjacent sheets to provide thermal breaks between adjacent sheets. Preferably, plural dimpled sheets are used. In another exemplary embodiment a combination of alternating flat and dimpled sheets is used. Alternatives materials that can be used include ceramics and graphite, for example Refractory metal sheets are available from Plansee LLC of Franklin, Mass., for example.

Heat shield assembly 64 is preferably attached to tube assembly 58 and includes opening 70 that allows shaft assembly 48 to translate along linear direction 56 discussed above. An exemplary attachment technique is illustrated in FIG. 4 and includes using wire 66 to attach heat shield assembly 64 to anchor 68 of outside wall 62 of tube assembly 58 at plural locations. Use of wire 66 and anchor 68 to attach heat shield assembly 64 to outside wall 62 of tube assembly 58 is exemplary and other attachment techniques that achieve the same result can be used such as those including use of fasteners or spot welding or the like.

Vacuum deposition source 10 preferably comprises an optional alignment system to aid in positioning crucible support assembly 26 relative to base flange 12 during assembly as can be seen with reference to FIGS. 2 and 3. Base flange 12 includes alignment rods 72 extending from base flange 12. Crucible support assembly 26 includes alignment tubes 74 that extend from support flange 40 and correspond with openings 76 provided in support flange 40. During assembly, alignment rods 72 are aligned with and inserted into openings 76 and are subsequently linearly guided by alignment tubes 74 as crucible support assembly 26 is moved into position to be attached to base flange 12.

As can be seen in FIG. 2, crucible support assembly 26 also preferably includes thermocouple 78 that functions to measure temperature and provide control feedback. Thermocouple 78 is removably attached to port 80 of support flange 40. Thermocouple 78 includes junction 82 that is preferably positioned within heater 28 adjacent to crucible support cup 50. Preferably, thermocouple 78 is encapsulated in pyrolytic boron nitride, which helps to protect thermocouple 78 from deposition materials and also helps to provide mechanical support for thermocouple 78. An appropriate thermocouple can be selected based on the particular temperature range to be measured as well as the vacuum environment in which the thermocouple will be used. For example, a Type-C thermocouple can be used. Any desired temperature measurement device can be used, however, as such devices are well known to those skilled in the art of vacuum equipment. Temperature measurement devices including thermocouples are available from Omega Engineering, Inc. of Stamford, Conn., for example.

Figure 5:
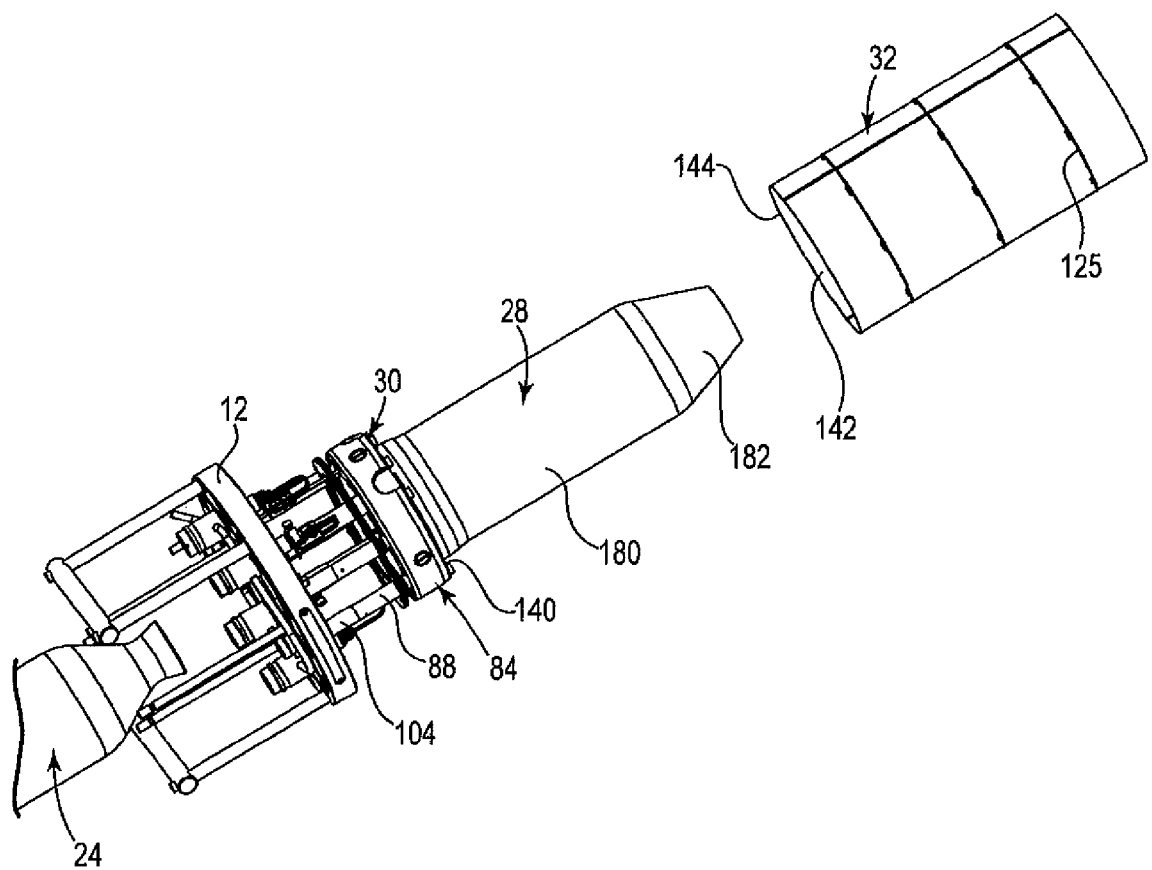
FIG. 5 is a partial exploded view of the deposition source shown in FIG. 1 and showing in particular an exemplary heater support assembly with an exemplary heater and an exemplary tubular heat shield assembly in accordance with the present invention.
Figure 6:
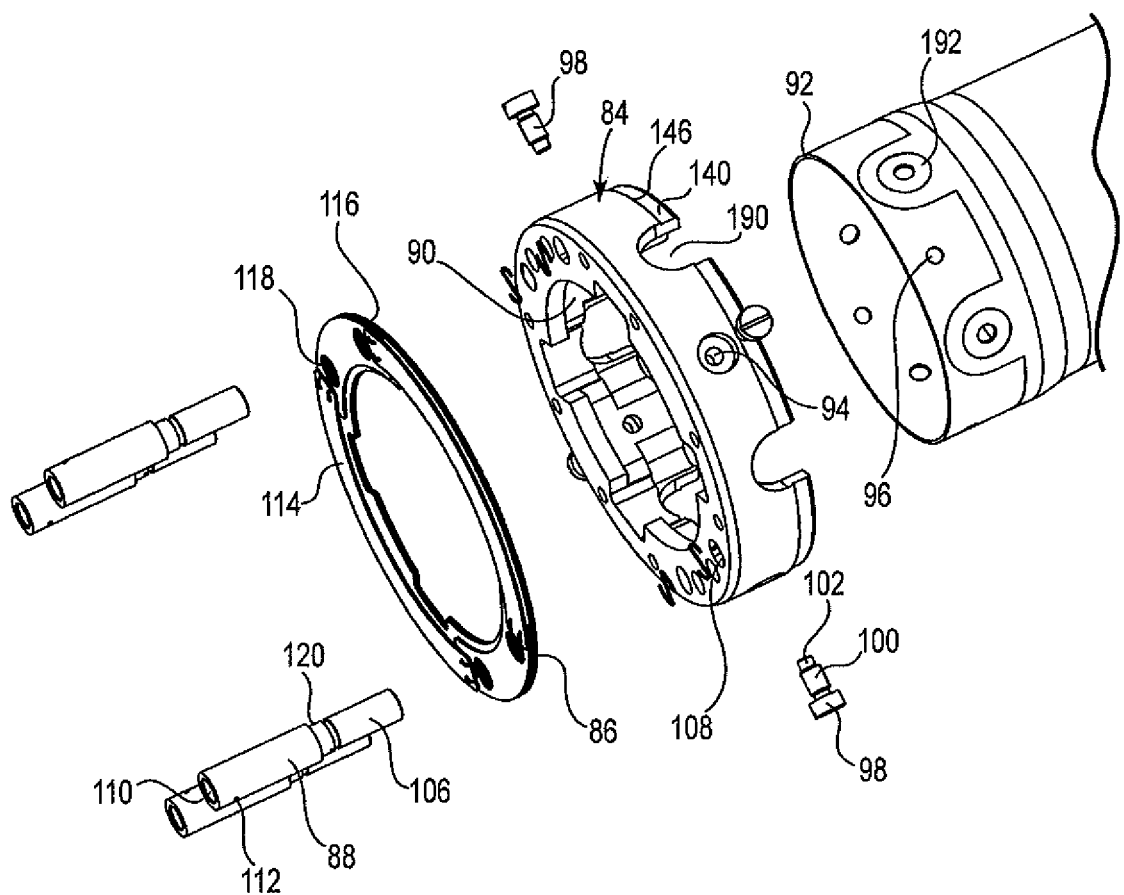
FIG. 6 is a partial exploded view of the heater support assembly and heater shown in FIG. 5 in accordance with the present invention.

Referring to FIGS. 5 and 6 in particular, heater 28 is preferably removably and adjustably positioned relative to base flange 12 by heater support assembly 30. Heater support assembly 30 preferably comprises support base 84, heat shield assembly 86, and height adjustment legs 88. Support base 84 comprises a generally cylindrical ring-like structure having recessed region 90 that receives end 92 of heater 28. Preferably, recessed region 90 and end 92 are designed to have a close sliding fit. Threaded openings 94 of support base 84 along with openings 96 of heater 28 when end 92 of heater 28 is positioned in recessed region 90 of support base 84. Fasteners 98 comprise a threaded portion 100 and a non-threaded portion 102. When positioned in openings 94 of support base 84 non-threaded portions 102 of fasteners 98 engage with openings 96 of heater 28 to secure heater 28 in place relative to heater support base 84. Heater support base 84 and fasteners 98 preferably comprises graphite. Graphite material is available from Poco Graphite, Inc. of Decatur, Tex., for example. A preferred graphite material is referred to as fine grain isostatically molded graphite.

Heater support assembly 30 further preferably comprises plural rotatable height adjustment legs 88 that rotatably engage with respective fixed support legs 104 of base flange 12. Adjustment legs 88 each comprise threaded portion 106 that threads into each respective threaded bore 108 of heater support base 84. Adjustment legs 88 also each include bore 110 that rotatably engages with a shaft portion (not shown) of each respective fixed support leg 104 of base flange 12. Height adjustment legs 88 preferably comprise graphite. Graphite material is available from Poco Graphite, Inc. of Decatur, Tex., for example. A preferred graphite material is referred to as fine grain isostatically molded graphite. Fixed support legs 104 preferably comprise stainless steel and are preferably welded or otherwise secured to base flange 12.

In use, rotation of height adjustment legs 88 varies the height of support base 84 relative to base flange 12 as well as the height of orifice 16 of crucible 24 relative to base flange 12. Such height adjustment is described in further detail below. Height adjustment legs 88 also each include opening 112 that can be aligned with a corresponding opening (not shown) of each fixed leg 104. A suitable wire or the like (not shown) is preferably positioned in opening 112 and the corresponding opening of fixed leg 104 to prevent rotation of height adjustment 88 relative to fixed leg 104.

Continuing to refer to FIGS. 5 and 6, heater support assembly 30 also comprises heat shield assembly 86 as noted above. Heat shield assembly 86 preferably comprises support plate 114 and plural layers of refractory metal sheets 116 such as those made from tantalum, tungsten, niobium, and molybdenum, for example. With reference to FIG. 6, in particular, heat shielding assembly 86 includes openings 118 that receive height adjustment legs 88. Height adjustment legs 88 each comprise shoulder 120, which supports heat shield assembly 86 when assembled as shown in FIG. 5. Height adjustment legs 88 also each comprise channel 122 spaced apart from shoulder 120 and which can receive a wire or retaining clip (not shown) to secure heat shield assembly 86 relative to height adjustment legs 88. Support plate 114 preferably comprises pyrolytic boron nitride. Alternative materials that can be used include ceramics and graphite, for example Refractory metal sheets 116 may be flat, knurled, dimpled, or otherwise embossed to help space apart adjacent sheets to provide thermal breaks between adjacent sheets. Preferably, plural and knurled (or dimpled or the like) sheets are used. In another exemplary embodiment a combination of alternating flat and dimpled sheets is used.

Vacuum deposition source 10 also preferably includes tubular heat shield assembly 32 as noted above. Heat shield assembly 32 functions to help prevent radiant heat from escaping from vacuum deposition source 10, which helps to improve efficiency and controllably of vacuum deposition source 10 during operation. Heat shield assembly 32 also functions to help position and support heater 28 as explained in more detail below.

Figure 7:
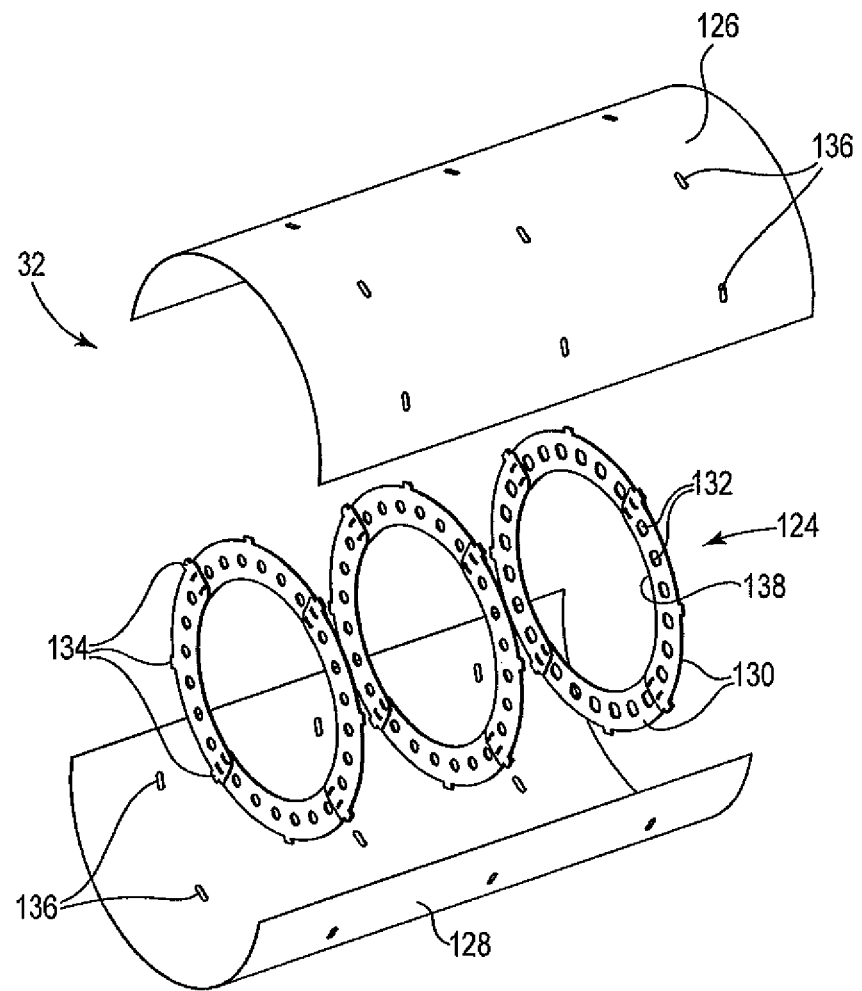
FIG. 7 is an exploded view of the tubular heat shield assembly shown in FIG. 5 in accordance with the present invention.

Referring to FIG. 7, exemplary tubular heat shield assembly 32 comprises support rings 124, first heat shield 126, and second heat shield 128. Support rings 124 preferably comprise plural arcuate sections 130, Support rings 124 may, however, comprise a single monolithic ring structure as plural sections are not required but are used in a preferred embodiment to provide efficient use of material. Although three support rings 124 are illustrated in exemplary tubular heat shield assembly 32, it is contemplated that any desired number of support rings can be used. Preferably, support rings 124 comprise pyrolytic boron nitride but other materials can be used.

Preferably, arcuate sections 130 are interconnected using refractory metal wire that passes through openings in overlapping ends of adjacent arcuate sections 130. Any desired attachment technique can be used, however, such as by using fasteners or the like, for example. As illustrated, support rings 124 also optionally comprise openings 132 that function to provide conductance for pumping. In one preferred embodiment, at least one of support rings 124 provides a close fit with either 28. Preferably, such support ring includes an identifying mark or the like such as by using square openings in contrast with round openings 132, for example.

Support rings 124 additionally include plural tabs 134 spaced apart around the circumference of the outside diameter of support rings 124. When assembled, tabs 134 mate with slots 136 provided in first and second heat shields 126 and 128, respectively. Wires 125 are preferably wrapped around first and second heat shields 126 and 128 and join together such as by twisting respective ends together. Preferably, wires 125 are also engaged with tabs 134. Edges of first and second heat shields 126 and 128 may be overlapped or may be butted together.

First and second heat shields 126 and 128, respectively, preferably comprise arcuate refractory metal sheets such as those made from tantalum, tungsten, niobium, and molybdenum, for example. While two heat shields are illustrated in the exemplary heat shield assembly 32 it is contemplated that any number of arcuate heat shield portions having plural seams can be used to form heat shield assembly 32 including use of a single sheet of refractory material that is rolled to form a cylindrical structure having a single seam. First and second heat shields 126 and 128, respectively, each comprise a single layer, as shown. It is contemplated, however, that plural layers of refractory metal material can be used. For example, plural layers of alternating flat and knurled (or dimpled or the like) refractory metal sheets can be used.

Referring back to FIGS. 5 and 6, support base 84 comprises outside surface 140 that preferably removably and slidingly couples with inside surface 142 of heat shield assembly 32. When assembled, end 144 of heat shield assembly 32 preferably rests against shoulder 146 of support base 84. Preferably, outside surface 140 of support base 84 and inside surface 142 of heat shield assembly 32 are designed to have a sliding fit. Such a sliding fit is exemplary and it is contemplated that other coupling techniques can be used to couple heat shield assembly 32 with support base 84 such as by using one or more of fasteners, pins, and mechanical devices, for example.

Figure 8:
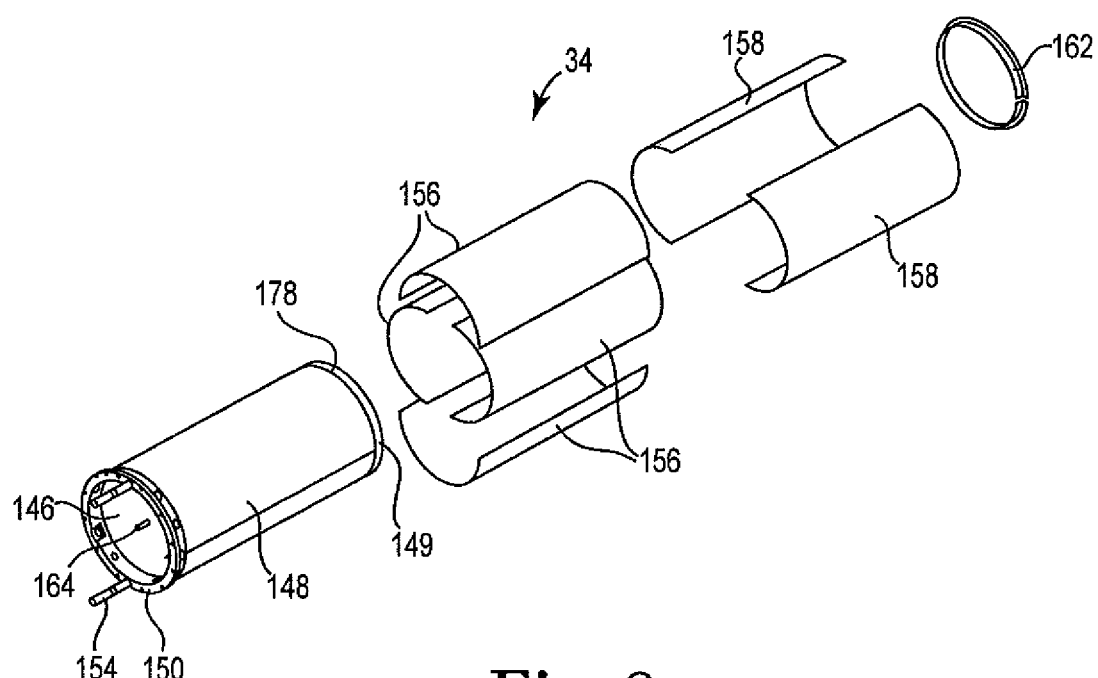
FIG. 8 is an exploded view of the liquid cooling enclosure shown in FIG. 2 in accordance with the present invention.

With reference to the cross-sectional view of FIG. 2 and the exploded view of FIG. 8, liquid cooling enclosure 34 preferably comprises inside and outside spaced apart walls, 146 and 148, respectively, end ring 149, and mounting flange 150. Preferably, walls 146 and 148, end ring 149, and mounting flange 150 comprise stainless steel. Inside and outside spaced apart walls, 146 and 148, respectively, at least partially define fluid channel 152. Fluid channel 152 is in fluid communication with tubes 154 that allow a desired cooling fluid, such as water, for example, to be circulated through fluid channel 152. Liquid cooling enclosure 34 functions to help prevent radiant heat from escaping from vacuum deposition source 10, which helps to improve efficiency and controllably of vacuum deposition source 10 during operation.

When assembled, mounting flange 150 is attached to base flange 12 of deposition source 10 using conventional threaded fasteners or the like. Tubes 154 pass through base flange 12 via sealing feed-throughs (not visible). Such feed-throughs are conventional and well-known and typically include an o-ring and ferrule that provide an appropriate vacuum seal suitable for the desired vacuum level and operating temperatures. Suitable feed-throughs are available from Swagelok, Fluid System Technologies of Solon, Ohio, for example.

Figure 9:
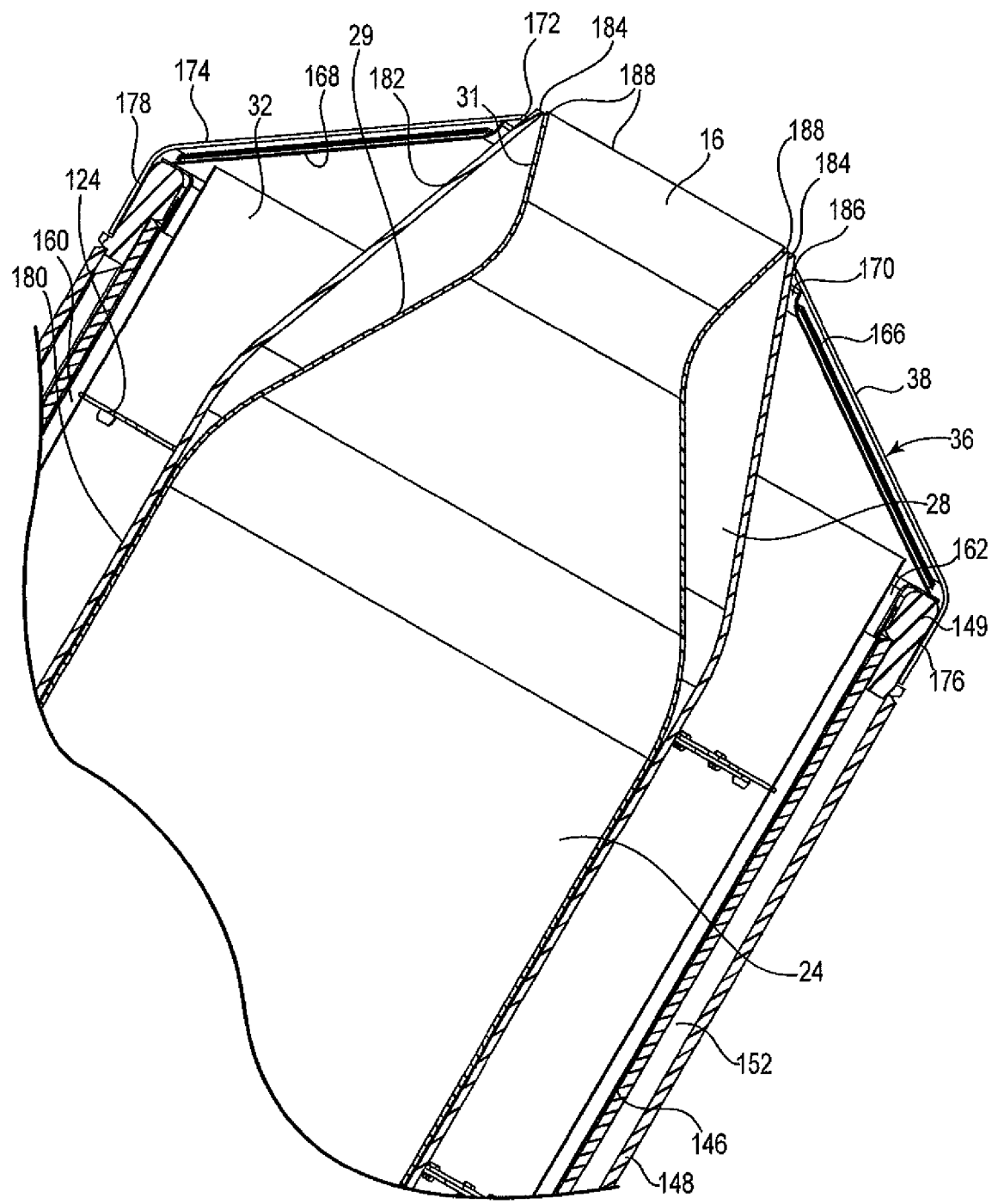
FIG. 9 is a partial cross-sectional view of the deposition source shown in FIG. 1 in accordance with the present invention.
Figure 10:
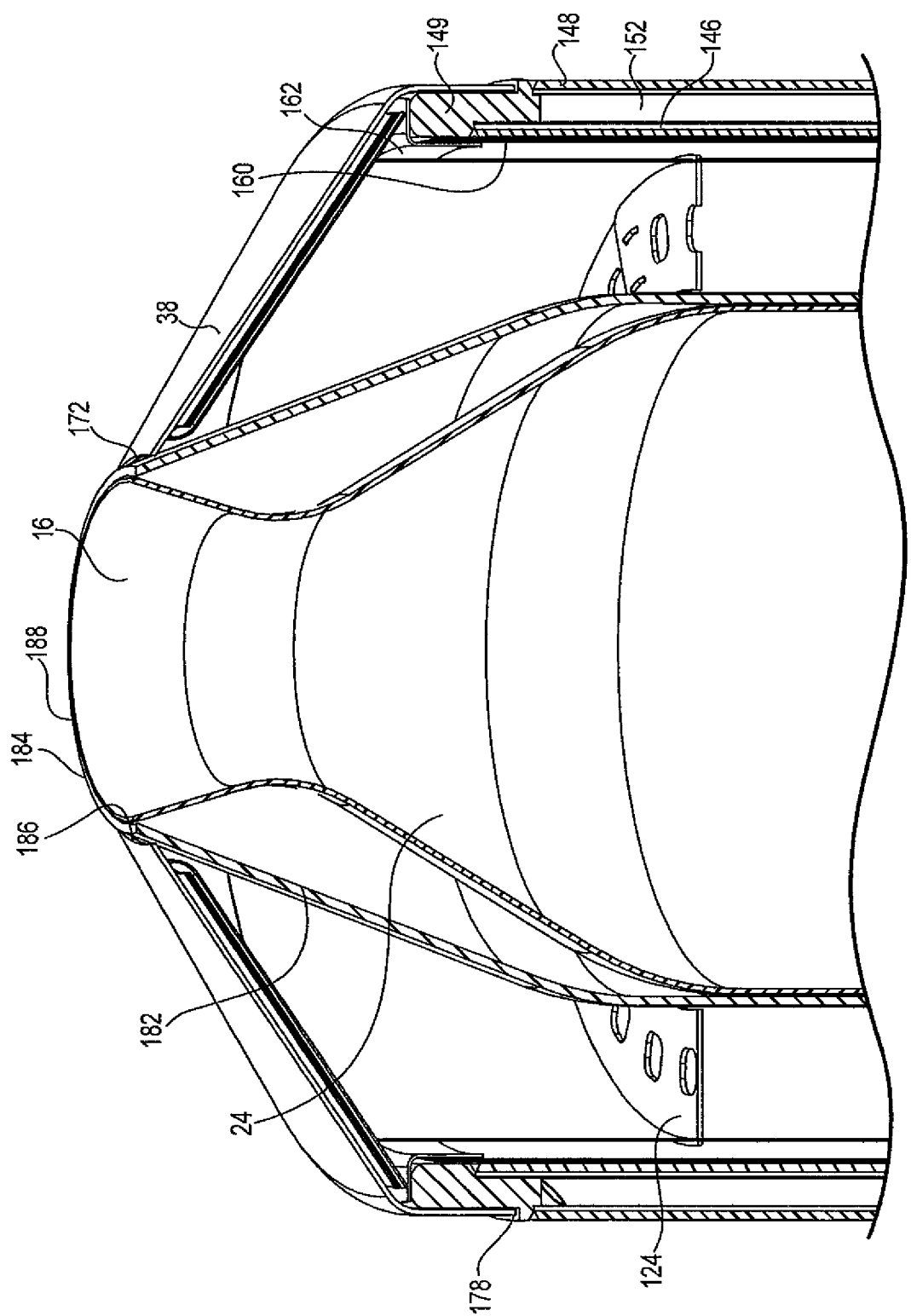
FIG. 10 is a partial cross-sectional perspective view of the deposition source shown in FIG. 1 in accordance with the present invention.

Referring to the exploded view of FIG. 8 and the detail views of FIGS. 9 and 10, in particular, liquid cooling enclosure 34 preferably comprises heat shield sheets 156, heat shield sheets 158, and support ring 162. When assembled, heat shield sheets 156 and 158 preferably form a cylindrical layered assembly 160. Heat shield sheets 156 and 158 are preferably attached to support ring 162 and can be attached to each other, if desired, such as by using one or more of refractory metal wire, fasteners, clips, and spot welding.

As illustrated, heat shield sheets 156 and 158 are provided in pairs and are preferably arranged so an overlapping layer covers seams between ends of sheets. Heat shield sheets 156 and 158 do not need to be provided as pairs, however, and can be provided as any number of arcuate sheet portions comprising plural seams or as a single sheet comprising a single seam. Although heat shield sheets 156 and 158 are illustrated as providing three layers of heat shielding, any number of layers can be used to achieve a desired heat shielding function. For example, plural layers of alternating flat and knurled (or dimpled or the like) refractory metal sheets can be used.

Cylindrical layered assembly 160 is preferably positioned inside liquid cooling enclosure 34 as can be seen in the cross-sectional detail views of FIGS. 9 and 10. As shown, heat shield sheets 156 and 158 are in contact with support ring 162. Support ring 162 engages with end ring 149 of liquid cooling enclosure 34, as shown, preferably to secure cylindrical layer assembly 160 relative to liquid cooling enclosure 34. Preferably, as can be seen in FIG. 8, cylindrical layered assembly 160 is also held in place within liquid cooling enclosure 34 using plural holding clips 164 that are preferably spot welded to the inside wall 146 of liquid cooling enclosure 34. Engagement between support ring 162 and end ring 149 and use of holding clips 164 as illustrated is exemplary and any suitable structure can be used to provide appropriate heat shielding for vacuum deposition source 10.

As shown, cylindrical layered assembly 160 extends along a portion of the length of liquid cooling enclosure 34 less than the overall length of liquid cooling enclosure 34. Cylindrical layered assembly 160 can, however, be designed to extend along any desired portion of inside wall 146 of liquid cooling enclosure 34. Also, it is contemplated that cylindrical layer assembly 160 can comprise plural sections that are assembled or positioned relative to each other to form a structure having a desired length.

Heat shield sheets 156 and 158 as well as support ring 162 preferably comprise refractory metal sheets such as those made from tantalum, tungsten, niobium, and molybdenum, for example. In one exemplary preferred embodiment heat shield sheets 156 comprise molybdenum and heat shield sheets 158 comprise tungsten and support ring 162 comprises tantalum. In such exemplary preferred embodiment, heat shield sheets 158 form the innermost layer of cylindrical layered assembly 160. That is, heat shield sheets 156 preferably surround heat shield sheets 158. Such arrangement is exemplary and heat shield sheets 156 and 158 can be arranged in any desired order, comprise any desired material, and comprise any desired knurling, dimpling, or embossing to achieve a desired heat shielding function.

As noted above, vacuum deposition source 10 includes conical heat shield assembly 36 and conical cover 38. Conical heat shield assembly 36 and conical cover 38 can be seen in cross-section in FIGS. 9 and 10 and can be seen as an exploded perspective view in FIG. 11. Conical heat shield assembly 36 preferably comprises plural conical heat shield sheets 166 and conical base 168. Preferably, conical heat shield sheets 166 and conical base 168 are made from refractory metals such as tantalum, tungsten, niobium, and molybdenum, for example. In an exemplary preferred embodiment, conical heat shield sheets 166 comprise molybdenum and conical base 168 comprises tantalum. Also, in an exemplary preferred embodiment, conical heat shield sheets 166 comprise one or more of knurling, dimpling, and embossing. Although conical heat shield sheets 166 are illustrated as providing three layers of heat shielding, any number of layers can be used to achieve a desired heat shielding function. Also, plural layers of alternating flat and knurled (or dimpled or the like) refractory metal sheets can be used. The illustrated embodiment of FIG. 11 is exemplary and heat shield sheets 166 can be arranged in any desired order, comprise any desired material, and comprise any desired knurling, dimpling, or embossing to achieve a desired heat shielding function.

Figure 11:
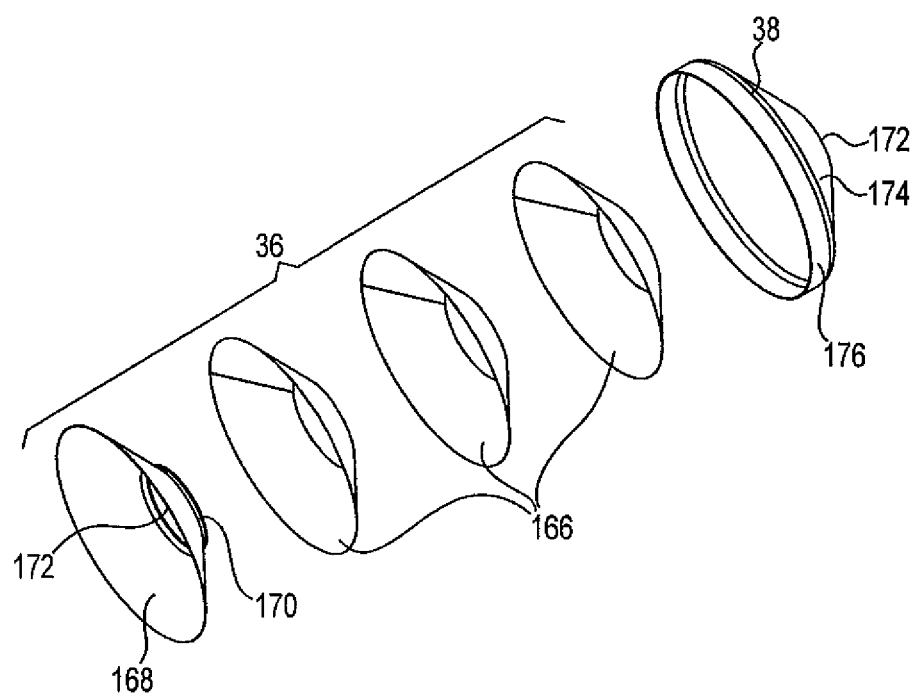
FIG. 11 is an exploded view of the conical heat shield assembly shown in FIG. 1 and showing in particular plural layers of conical heat shielding and the conical cover in accordance with the present invention.

Conical base 168, as can be seen in FIGS. 9, 10, and 11, comprises annular lip 170, opening 172, and end 174. When assembled as shown in FIGS. 9 and 10, end 174 rests on support ring 162 and opening 172 is positioned over heater 28. Conical heat shield sheets 166 preferably rest on and are supported by conical base 168, as illustrated in the exemplary embodiment. Annular lip 170 helps to retain and position conical heat shield sheets 166 relative to conical base 160. Preferably, conical base 168 and conical heat shield sheets 166 are held in place by gravity and by conical cover 38 as noted below. If desired, however, fasteners, holding devices, retaining devices, and the like may be used to secure any of conical base 168 and conical heat shield sheets 166 relative to one or more of each other and end ring 149.

Continuing to refer to FIGS. 9, 10, and 11, conical cover 38 preferably comprises opening 172, conical portion 174, and cylindrical portion 176. When assembled as shown in FIGS. 9 and 10, cylindrical portion 174 mates with recessed portion 178 of end ring 149 of liquid cooling enclosure 34. Opening 172 is positioned over heater 28 and preferably rests on annular lip 170 of conical base 168. Assembled as such, conical cover 38 helps to trap conical heat shield sheets 166 between support ring 162 and conical cover 38. Preferably, cylindrical portion 176 and recessed portion 178 of end ring 149 are designed to provide a close friction fit when assembled together. That is, preferably friction between cylindrical portion 176 and recessed portion 178 functions to hold conical cover 38 removably in place on end ring 149 without the use of additional fasteners or holding devices. It is contemplated, however, that any desired fasteners, holding devices, retaining devices, and the like may be used to secure conical cover 38 to end ring 149.

In an exemplary embodiment, conical cover 38 comprises pyrolytic boron nitride. It is contemplated, however, that conical cover 38 may comprise any desired material depending on the particular application of deposition source 10. Exemplary materials that can be used to form conical cover 38 include refractory metals and ceramics, for example. Pyrolytic boron nitride is a preferred material for construction of components used for vacuum deposition. Pyrolytic boron nitride is generally inert, can withstand high temperatures, is generally clean and does not contribute undesirable impurities to the vacuum environment, is generally transparent to certain wavelengths of infrared radiation, and can be fabricated into complex shapes, for example.

As noted above in the Background section, undesirable accumulation of deposition material in the vicinity of the effusion orifice of vacuum deposition sources can occur under certain deposition conditions. Typically, such deposition conditions include one or more of high deposition temperatures and high deposition rates such as those used for deposition of metals or semiconductors materials, such as copper, indium, and gallium, for example. For purposes of the present invention, high deposition temperatures refer to the operating temperature of the region near the effusion orifice of a crucible. Continued accumulation of deposition material can reduce the area of the effusion orifice and thereby reduce the deposition rate. Ultimately, continued accumulation of deposition material can effectively close the effusion orifice so the deposition rate is unacceptably low or non-existent.

Deposition sources in accordance with the present invention such as exemplary deposition source 10 can advantageously provide high deposition rates at high operating temperatures of materials without the above-described problem related to accumulation of deposition material at the effusion orifice. For example, as can be seen in FIGS. 9 and 10, heater 28 includes cylindrical portion 180 and conical portion 182. Conical portion 182 of heater 28 is preferably designed to provide uniform radiant heat to first and second conical portions, 29 and 31, respectively of crucible 24. Such uniform heating can be accomplished by designing heater 28 to be closely fit or otherwise slidingly engaged with crucible 24, provide heating to substantially all surfaces of crucible 24, and by designing heat shielding that helps to keep radiant heat within a predetermined region of the deposition source 10. When designed as such, cold surfaces of crucible 24 are minimized and undesirable condensation of deposition material on the inside surface of crucible 24 is accordingly minimized or eliminated.

Another aspect of the present invention that is believed to help to minimize or eliminate the above-described problem related to accumulation of deposition material at the effusion orifice relates to conical cover 38. Because of the conical shape of conical cover 38, any particles that might be ejected from effusion opening 16 and land on conical cover 38 will tend to slide off of conical cover 38. Preferably, the slope of conical cover 38 is selected based on factors such as a particular deposition material to be used and the angle at which deposition source 10 is positioned in a vacuum deposition system. In a preferred exemplary embodiment, the angle of deposition source 10 is less than the angle of conical cover 38. In a preferred exemplary embodiment the angle of deposition source 10 as measured with respect to vertical is less than 40° and more preferably less than 30°. Determination of the geometry of conical cover 38 and the angle of deposition source 10 can be determined empirically for the particular deposition material and vacuum environment.

Yet another aspect of the present invention that is believed to help to minimize or eliminate the above-described problem related to accumulation of deposition material at the effusion orifice relates to the relative positions of conical cover 38 and heater 28. Referring to FIG. 9, edge 184 of heater 28 preferably extends past edge 186 of conical cover 38. In an exemplary embodiment, edge 184 of heater 28 preferably extends past edge 186 of conical cover 38 by approximately 0.0-5.0 millimeters. In another exemplary embodiment, edge 184 of heater 28 preferably extends past edge 186 of conical cover 38 by approximately 2.0-5.0 millimeters. In yet another exemplary embodiment, edge 184 of heater 28 preferably extends past edge 186 of conical cover 38 by approximately 2.0-2.4 millimeters. The ranges indicated above are exemplary and the distance by which edge 184 of heater 28 extends past edge 186 of conical cover 38 can also be determined empirically for the particular deposition material and vacuum environment.

Adjustment of edge 184 of heater 28 with respect to edge 186 of conical cover 38 can be performed using height adjustment legs 88 of heater support assembly 36. Referring back to FIG. 5, height adjustment legs 88 can be rotated with respect to fixed legs 104 to translate heater support base 84 and heater 28 relative to the base flange 12. Preferably, a fixture (not shown) is used to set the height of edge 184 of heater 28 with respect to a known surface such as a surface of base flange 12.

Yet another aspect of the present invention that is believed to help to minimize or eliminate the above-described problem related to accumulation of deposition material at the effusion orifice relates to the relative positions of heater 28 and crucible 24. Referring to FIG. 9, edge 188 of crucible 24 preferably extends past edge 184 of heater 28. In an exemplary embodiment edge 188 of crucible 24 preferably extends past edge 184 of heater 28 by approximately 0.0-2.0 millimeters. In another exemplary embodiment edge 188 of crucible 24 preferably extends past edge 184 of heater 28 by approximately 0.0-2.0 millimeters. In another exemplary embodiment edge 188 of crucible 24 preferably extends past edge 184 of heater 28 by approximately 0.2-1.0 millimeters. In yet another exemplary embodiment edge 188 of crucible 24 preferably extends past edge 184 of heater 28 by approximately 0.2-0.5 millimeters. The ranges indicated above are exemplary and the distance by which edge 188 of crucible 24 extends past edge 184 of heater 28 can also be determined empirically for the particular deposition material and vacuum environment.

Adjustment of edge 188 of crucible 24 with respect to edge 184 of heater 28 can be performed using adjustment knob 52 of crucible support assembly 26. Referring to FIG. 2 rotation of knob 52 translates crucible support cup 50 and crucible 24 relative to base flange 12. When a desired position for crucible 24 is obtained lock not 54 is engaged to lock the position of crucible 24.

Heater 28 preferably comprises a monolithic heating device comprising pyrolytic graphite conductive material sandwiched between insulating pyrolytic boron nitride. Such heaters are available from Momentive Performance Materials of Strongsville, Ohio. Preferably, heater 28 includes two distinct serpentine resistive elements that provide two distinct heating zones that can be controlled independently from each other. One heating zone is preferably used to heat cylindrical portion 180 and the second heating zone is preferably used to heat conical portion 182. Advantageously, conical portion 182 can be operated at a higher temperature than cylindrical portion 180, which can help prevent condensation of deposition material near the effusion orifice 16 of crucible 24. It is contemplated that heater 28 may comprise any desired number of resistive elements including a single resistive element.

Figure 12:
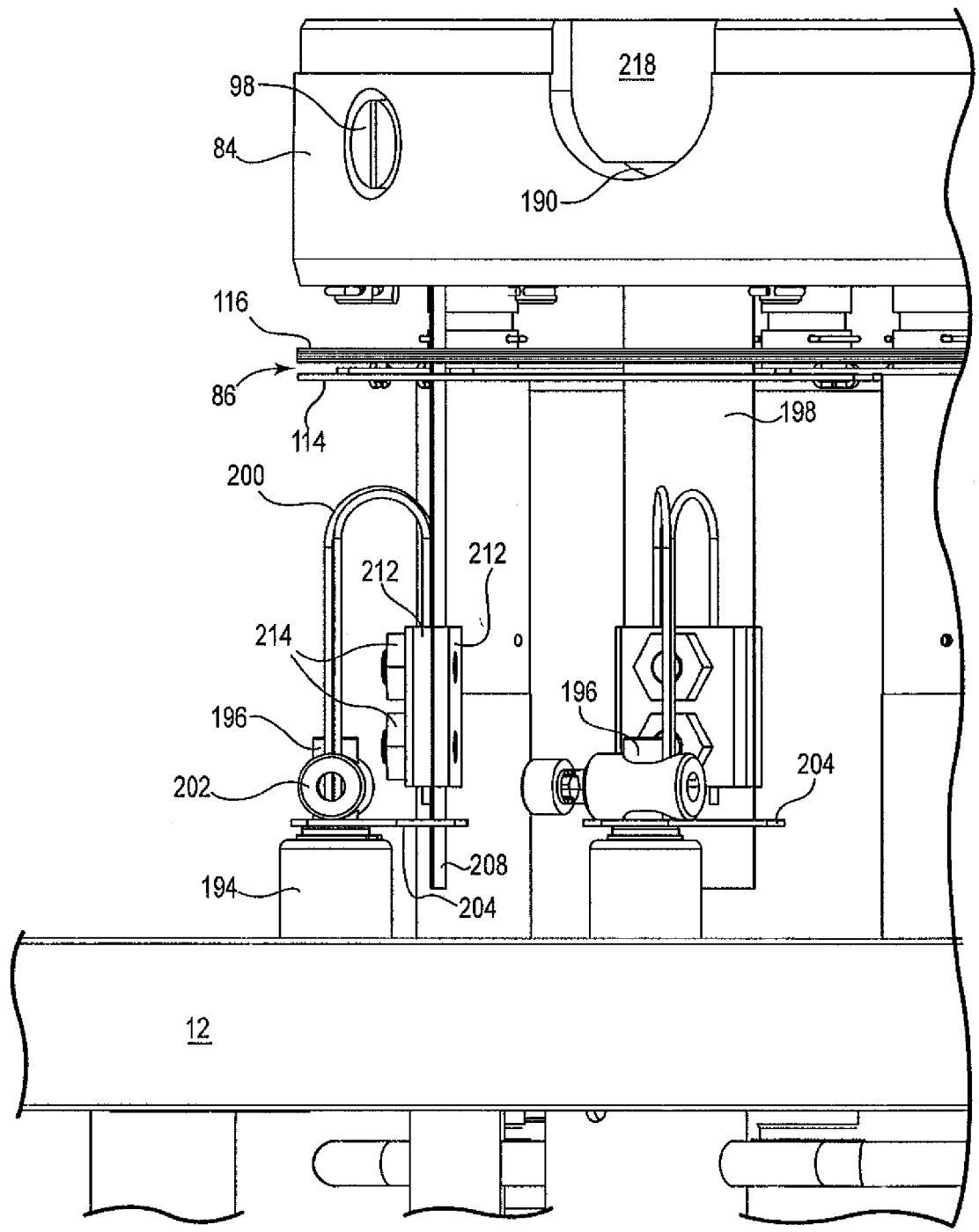
FIG. 12 is a partial side view of the deposition source shown in FIG. 1 and showing in particular exemplary electrical contacts in accordance with the present invention.
Figure 13:
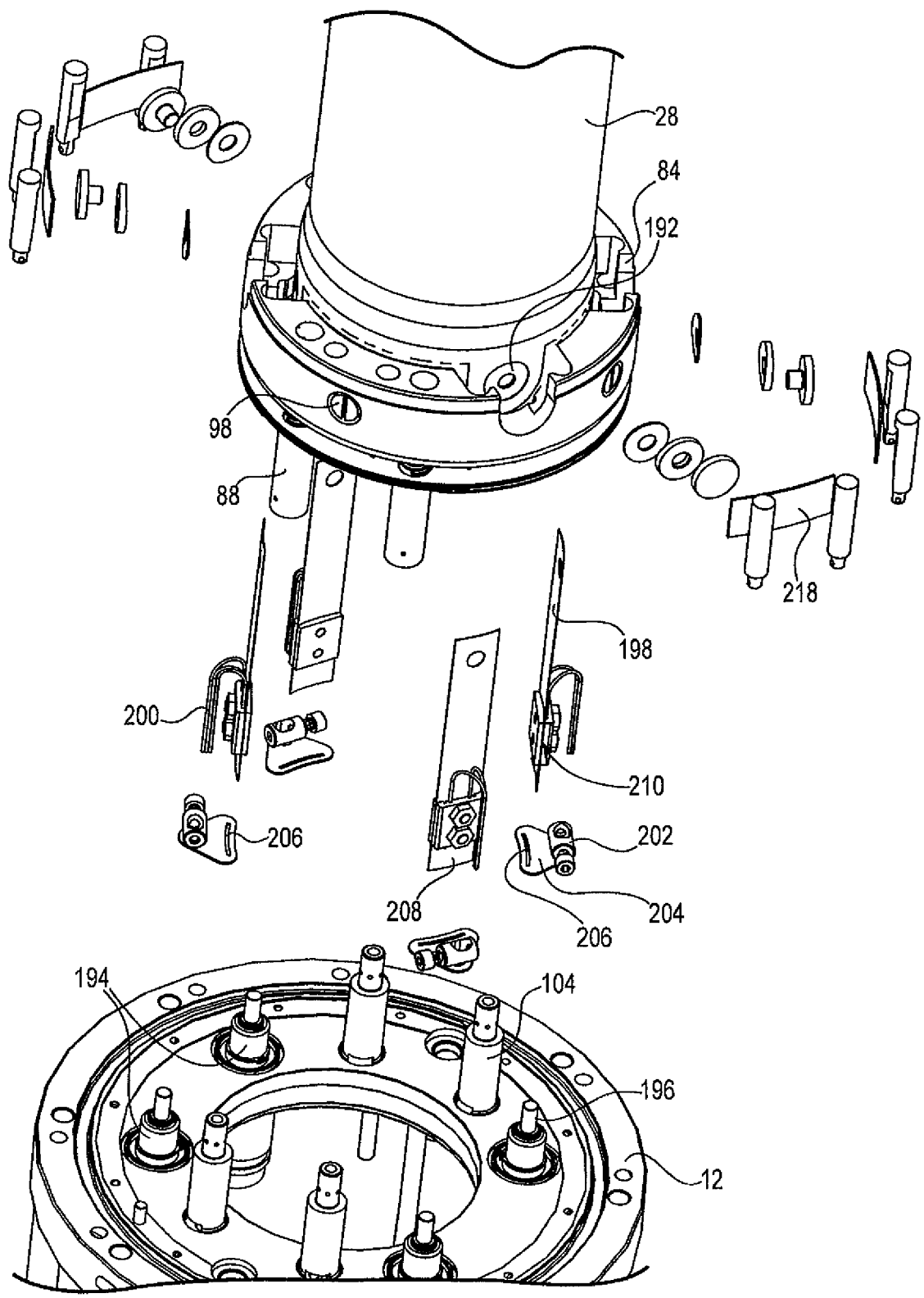
FIG. 13 is a partial exploded view of the deposition source shown in FIG. 1 and further showing electrical contacts in accordance with the present invention.

Referring now to FIGS. 12-17 generally, and FIGS. 12-13 in particular, support base 84 further preferably comprises cutout regions 190 that align with electrical contacts 192 of heater 28 when end 92 of heater 28 is positioned in recessed region 90 of support base 84. As illustrated, heater 28 comprises four electrical contacts 192 that provide power to two distinct resistive elements. Power is provided to electrical contacts 192 via power feed-throughs 194 that are preferably removably coupled with base flange 12. Power feed-throughs 194 each comprise power conductor 196, which typically comprises a molybdenum post and an o-ring vacuum seal.

Electrical contacts 192, as can be seen in FIG. 6, each comprise an exposed region of the associated graphite resistive element. Because end 92 of heater 28 is generally cylindrical, electrical contacts 192 comprise a cylindrical curvature having a known radius. Accordingly, structure used for electrical connection to cylindrically curving electrical contacts 192 is preferably designed to maximize contact area with electrical contacts 192 and provide consistent pressure to electrical contacts 192 throughout the operating temperature range of deposition source 10.

Power feed-throughs 194 are electrically removably connected to power straps 198 by flexible power cables 200. Preferably, power straps 198 are cylindrically curved to correspond with the radius of end 92 of heater 28 and taking into consideration the thickness of conductive washer 226 (described below). Cable connectors 202 receive flexible power cables 200 and power conductors 196 and function to clamp flexible power cables 200 to power conductors 196. Insulating power strap isolators 204 are preferably positioned on power conductors 196 below cable connectors 202, as illustrated. Insulating power strap isolators 204 each include curved slot 206 that receives end 208 of each power strap 198 and helps to hold each power strap 198 in place. In a preferred embodiment, insulating power strap isolators 204 comprise pyrolytic boron nitride although it is contemplated that other insulating materials can be used. Alternative structures for positioning ends 208 of power straps 198 can also be used. Use of cable connectors 202 and flexible power cables 200 illustrates an exemplary technique to removably electrically connect power conductors 196 to power straps 198 and those of skill in the art will recognize that other suitable techniques can be used to make such connection such as the use of one or more of alternative clamping structures, fasteners, connectors, and spot welding, for example.

Flexible power cables 200 are connected to power straps 198 with cable clamps 210. As illustrated, cable clamps 210 comprise clamping plates 212 and fasteners 214 that function to compressively clamp flexible power cables 200 to power straps 198. Cable clamps 210 illustrates an exemplary technique to removably electrically connect flexible power cables 200 to power straps 198 and those of skill in the art will recognize that other suitable techniques can be used to make such connection such as the use of one or more of alternative clamping structures, fasteners, connectors, and spot welding, for example. Preferably, a vacuum deposition source 10 is used in the presence of a corrosive vapor such as selenium, cable clamps 210 preferably comprise molybdenum with a stainless steel screw. Power straps 198 preferably comprise tungsten. Power cables 200 preferably comprise multi-stranded molybdenum wire.

In each connection, power strap 198 is preferably electrically removably connected to electrical contact 192 of heater 28 as illustrated by the exemplary connection technique shown in FIGS. 13-17. Power strap 198 preferably passes through notch 216 provided in support base 84. Electrical connection to electrical contact 192 is preferably maintained using spring 218 and loading pins 220 provided at each end of spring 218. Spring 218 applies spring force to pressure pin 222, which applies pressure to contact washer 224. As can be seen best in the cross-sectional view of FIG. 15, power strap 198 is preferably sandwiched between contact washer 224 and conductive washer 226.

As illustrated in the exemplary embodiment, loading pins 220 each preferably comprise cylindrical shoulder 236 rotatably positioned in bore 230 of support base 84. Referring to the cross-sectional view of FIG. 16, cylindrical shoulder 228 of each spring loading pin 220 includes opening 232 that receives retaining wire 234 that helps to hold spring loading pin 220 in place. It is contemplated that other retaining structure could be used such as use of a retaining clip and groove or the like. Referring back to FIG. 14, each spring loading pin 220 also preferably comprises flat portion 236 that engages with surface 238 of spring 218 when assembled, such as is illustrated in FIGS. 15 and 16. Varying the location of flat portion 236 can be used for adjustment of spring force.

Figure 14:
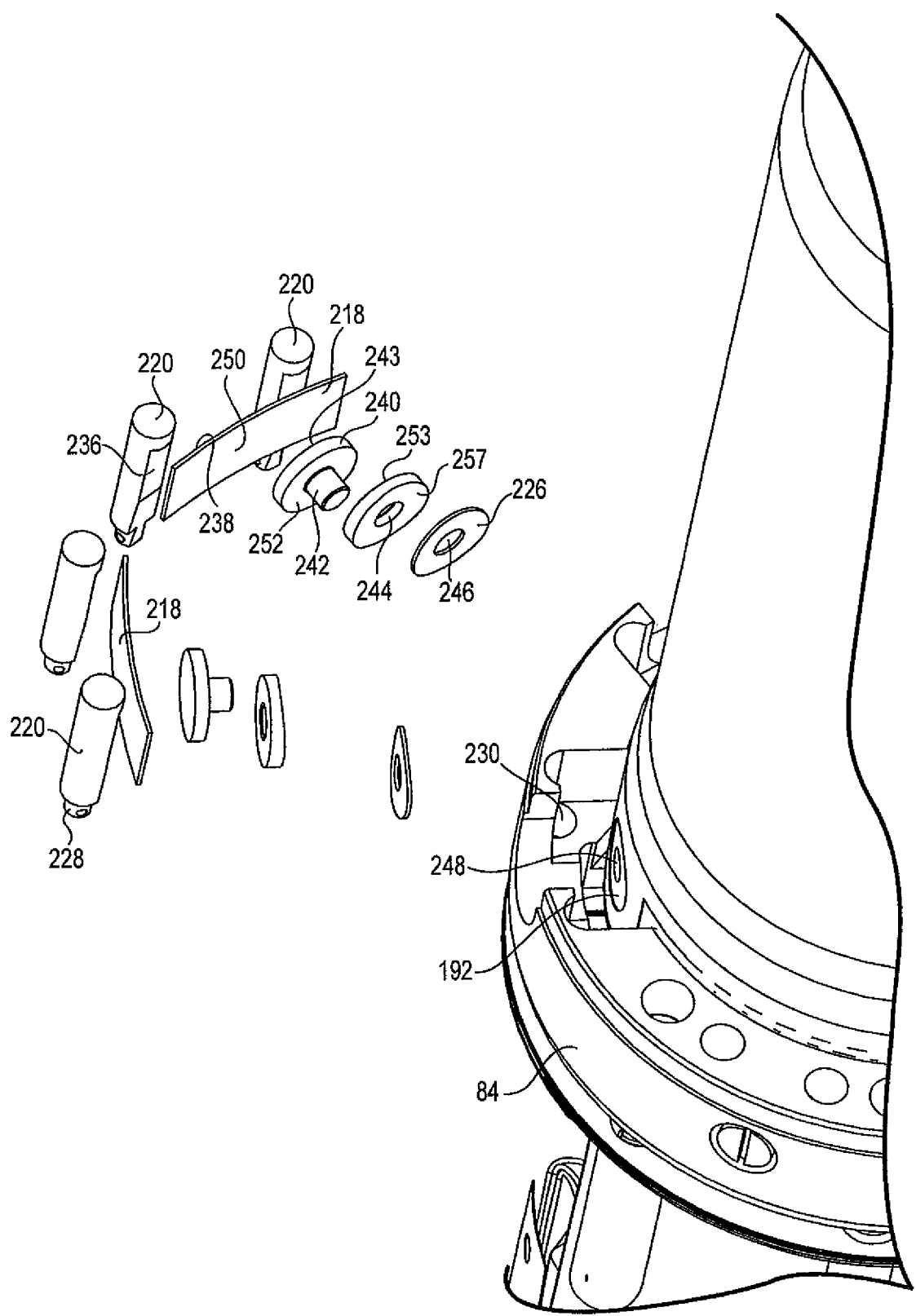
FIG. 14 is a partial exploded view of the deposition source shown in FIG. 1 and further showing electrical contacts in accordance with the present invention.
Figure 15:
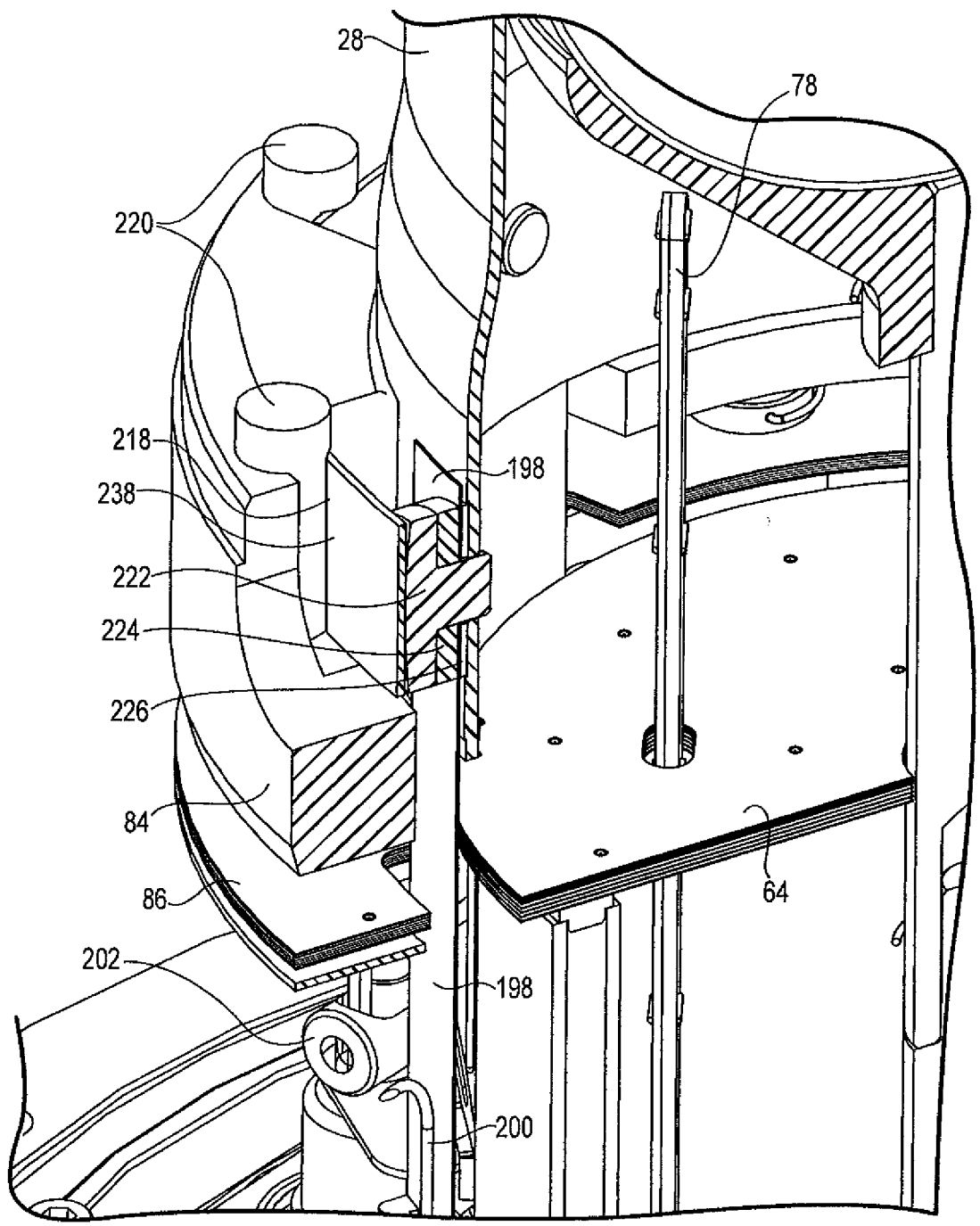
FIG. 15 is a partial cross-sectional perspective view of the deposition source shown in FIG. 1 and further showing electrical contacts in accordance with the present invention.
Figure 16:
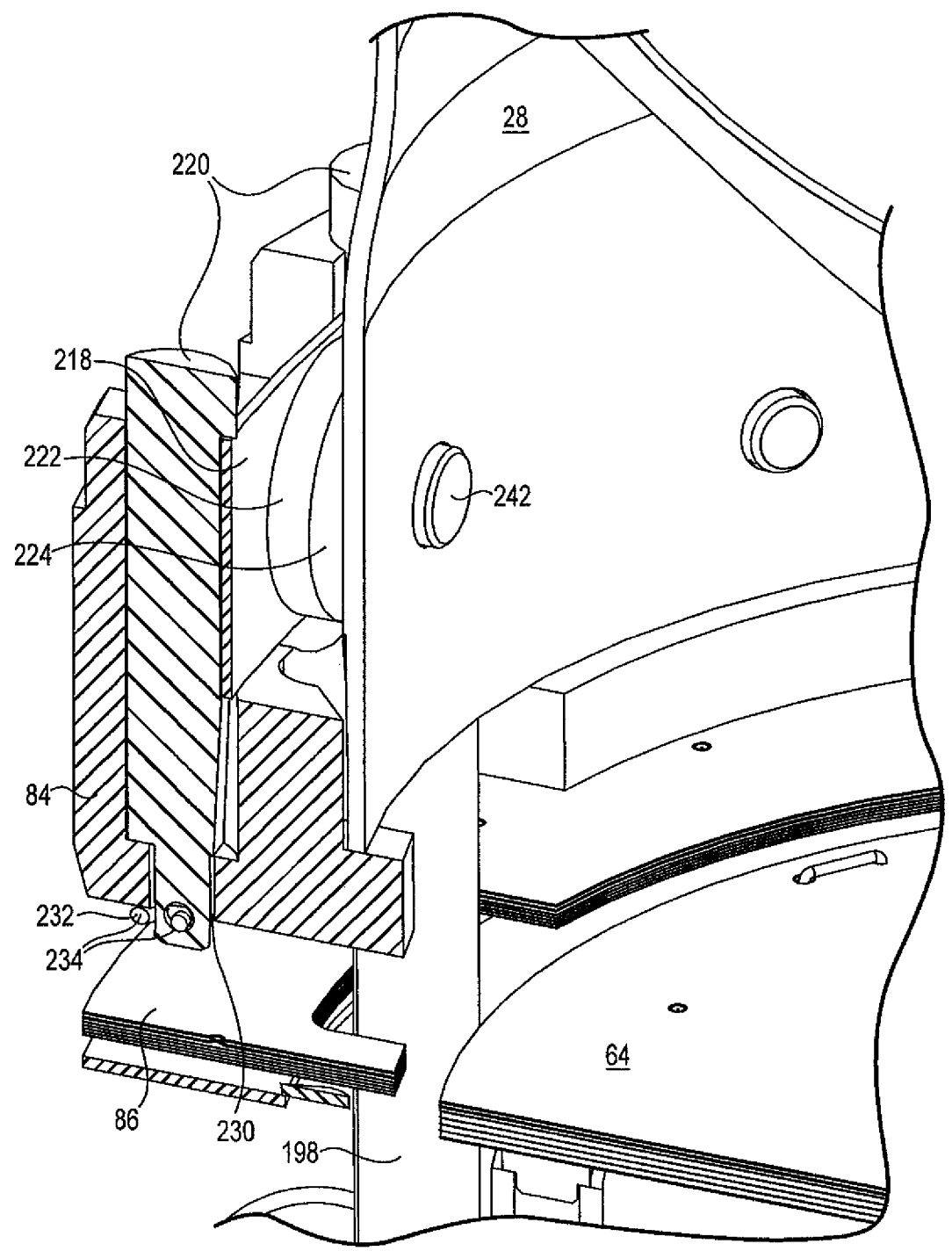
FIG. 16 is a partial cross-sectional perspective view of the deposition source shown in FIG. 1 and further showing electrical contacts in accordance with the present invention.
Figure 17:
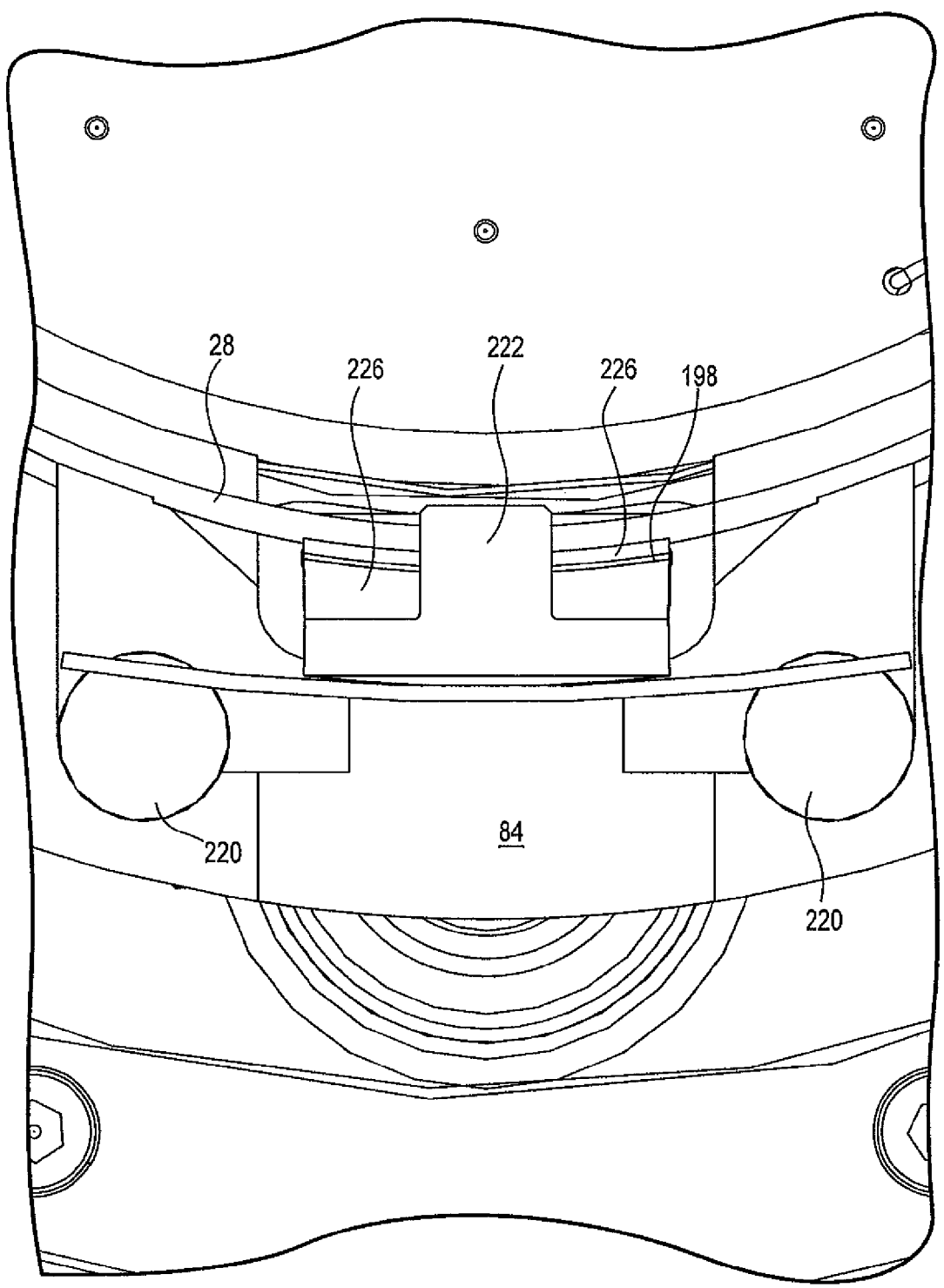
FIG. 17 is a partial top down cross-sectional view of the deposition source shown in FIG. 1 and further showing electrical contacts in accordance with the present invention.

Referring now to FIGS. 14 and 15, each pressure pin 222 preferably comprises head portion 240 and post portion 242. Post portion 242 of each pressure pin 222 preferably passes through opening 244 of contact washer 224, opening 246 of conductive washer 226, and opening 248 of heater 28 associated with each electrical contact 192. Preferably, surface 243 of head portion 240 comprises a spherically curving surface and is in contact with surface 250 of spring 218. A spherically curving surface preferred because a spherically curving is not orientation dependent when contacting surface 250. Preferably, the radius of spherically curving surface 243 comprises the radius that is less than or equal to than the distance that spring 218 needs to flex.

Surface 252 of head portion 240 preferably comprises a flat surface that mates with flat surface 253 of contact washer 244. Surface 257 of contact washer 224 preferably comprises a cylindrically curving surface and preferably has a radius determined by considering the radius of electrical contact 192, thickness of conductive washer 226, and thickness of power strap 198. Power strap 198 also preferably at a cylindrically curving shape that corresponds with the radius of electrical contact 192.

Springs 218 preferably comprise a resilient material that can maintain its ability to apply consistent pressure throughout the operating temperature range of deposition source 10. An exemplary preferred material comprises pyrolytic boron nitride because pyrolytic boron nitride is vacuum compatible, insulating, and can maintain a spring force at high temperatures. Other materials that can be used include insulating materials having suitable elastic properties, for example.

As shown in the exemplary illustrated embodiment, springs 218 preferably comprise a generally rectangular plate. The dimensions, geometry, and thickness of springs 218 are preferably designed to provide the desired spring force. Suitable characteristics for springs 218 can be determined empirically. Preferably, in an exemplary embodiment, a load of between about 3 to 8 pounds, as applied to electrical contacts 192, is used. Springs 218 may have any desired geometry, however such as that including serpentine structures or the like. Also, plural layers of material can be used to form springs 218 such as to provide a leaf spring structure, for example.

Loading pins 220, pressure pin 222, and contact washer 224 preferably comprise graphite. Other suitable materials can be used, however, for loading pins 220, pressure pin 222, and contact washer 224. Conductive washer 226 preferably comprises graphite. Other suitable materials can be used, however, for conductive washer 226. Graphite material is available from GrafTech Advanced Energy Technology, Inc. of Lakewood, Ohio. One preferred graphite material is referred to as nuclear grade GTA material.

Figure 18:
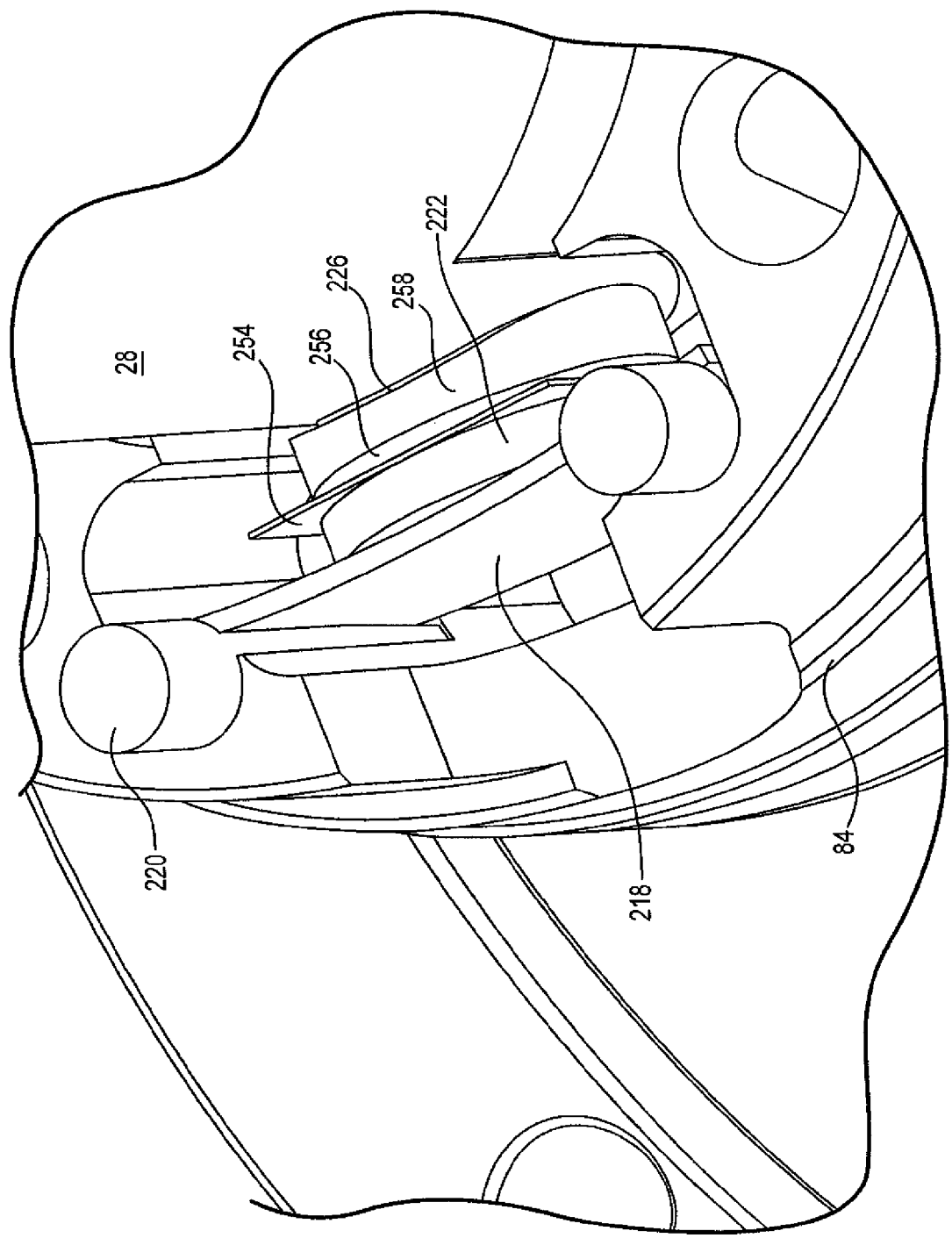
FIG. 18 is a partial perspective view of another exemplary deposition source in accordance with the present invention and showing in particular electrical contacts in accordance with another exemplary embodiment of the present invention.
Figure 19:
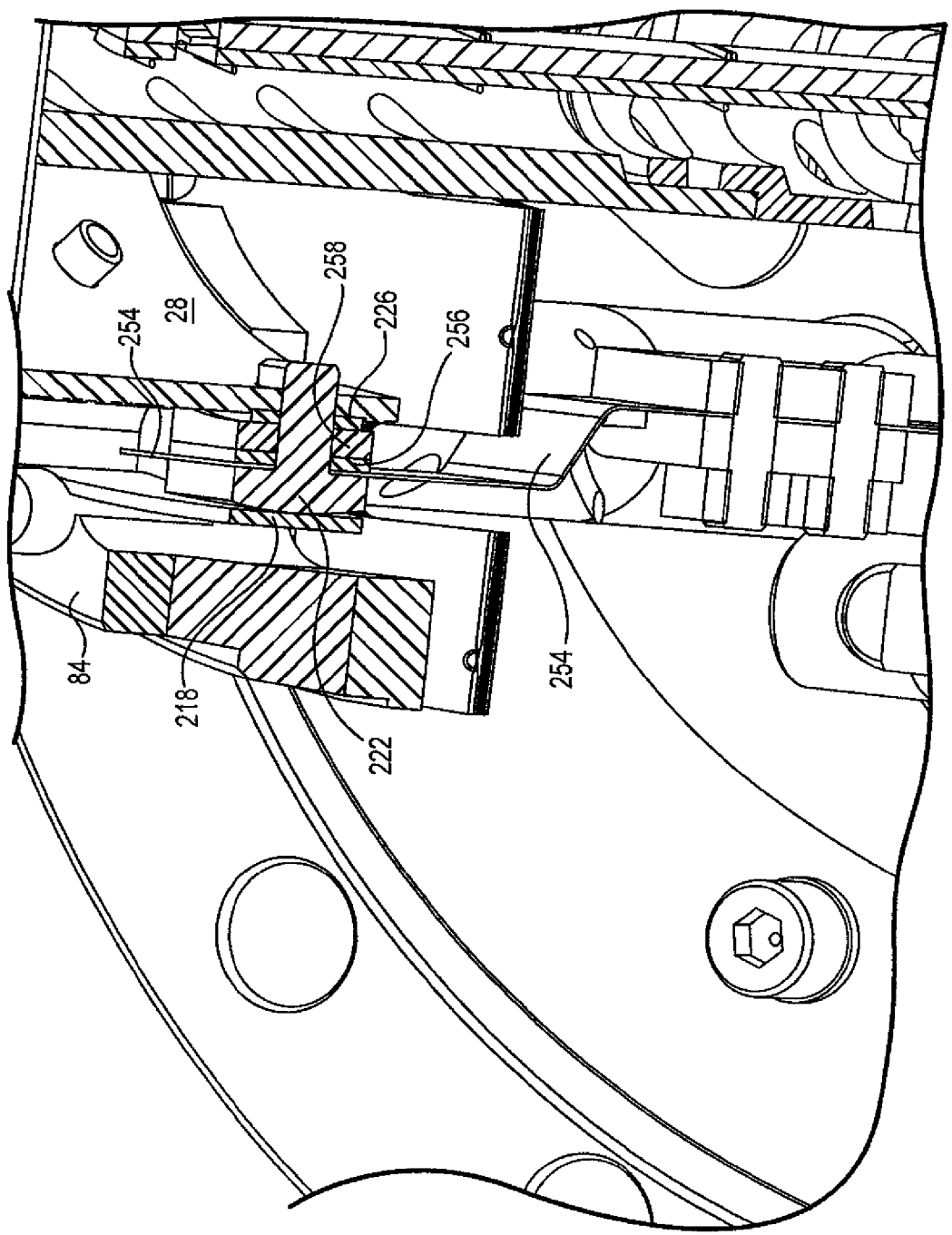
FIG. 19 is a partial cross-sectional perspective view of the deposition source shown in FIG. 18.

In FIGS. 18 and 19, another exemplary electrical contact assembly that can be used in accordance with the present invention is illustrated. In the embodiment illustrated in FIGS. 18 and 19, a flat power strap 254 is used instead of the arcuate power strap 198 described above. As shown, loading pins 220 and spring 218 apply force to pressure pin 222 in a similar manner as described above. Flat power strap 254 is preferably sandwiched between pressure pin 222 and conductive washer 256. Conductive washer 256 is in contact with contact washer 258, which is in contact with conductive washer 226. Conductive washer 226 contacts electrical contact 192 (not visible in FIGS. 18 and 19) of heater 28.

Figure 20:
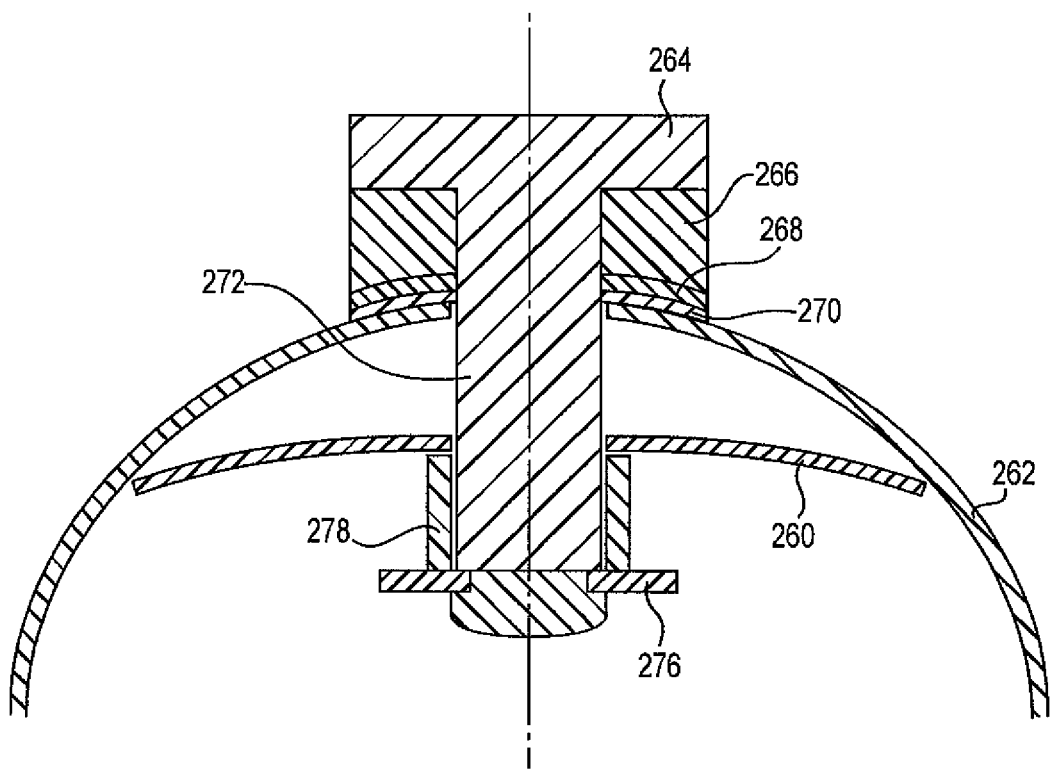
FIG. 20 is a schematic top down cross-sectional view of another exemplary deposition source in accordance with the present invention and showing in particular electrical contacts in accordance with another exemplary embodiment of the present invention.

In FIG. 20, another exemplary electrical contact assembly that can be used in accordance with the present invention is illustrated. In the embodiment illustrated in FIG. 20, spring 260 is positioned inside heater 262. Pressure pin 264 applies pressure to contact washer 266 and arcuate power strap 268 is sandwiched between contact washer 266 and conductive washer 270. Conductive washer 270 is in contact with an electrical contact (not shown) of heater 262. Pressure pin 264 includes post portion 272 that passes through contact washer 266, arcuate power strap 268, conductive washer 270, heater 262, and spring 260. End 274 of post portion 272 includes retaining clip 276 and loading tube 278 that function to maintain pressure of conductive washer 270 with the electrical contact (not shown) of heater 262 by the spring force provided by spring 260. Spring 260 may comprise a pyrolytic boron nitride spring as described above.

Vacuum deposition sources that can use electrical contacts described in the present invention are described in Applicant's co-pending US Patent Application entitled Electrical Contacts For U With Vacuum Deposition Sources, filed on Aug. 11, 2009 and having Ser. No. 12/539,458, the entire disclosure of which is incorporated by reference herein for all purposes.

The present invention has now been described with reference to several exemplary embodiments thereof. The entire disclosure of any patent or patent application identified herein is hereby incorporated by reference for all purposes. The foregoing disclosure has been provided for clarity of understanding by those skilled in the art of vacuum deposition. No unnecessary limitations should be taken from the foregoing disclosure. It will be apparent to those skilled in the art that changes can be made in the exemplary embodiments described herein without departing from the scope of the present invention. Thus, the scope of the present invention should not be limited to the exemplary structures and methods described herein, but only by the structures and methods described by the language of the claims and the equivalents of those claimed structures and methods.

What is claimed is:

1. A vacuum deposition source comprising:
a base flange configured to mount the vacuum deposition source to a vacuum chamber;
a crucible operatively supported relative to the base flange and configured to hold vacuum deposition material, the crucible comprising a cylindrical body portion, a conical portion, and an effusion orifice;
a heater operatively supported relative to the base flange and at least partially surrounding the crucible, the heater comprising a cylindrical body portion configured and positioned to provide thermal radiation to at least a portion of the cylindrical body portion of the crucible, the heater comprising a layered structure comprising a pyrolytic graphite electrically resistive layer positioned between pyrolytic boron nitride electrically insulative layers; and
a cooling enclosure operatively attached to the base flange at a first end of the cooling enclosure and extending along and at least partially surrounding the heater and the crucible, the cooling enclosure having an internal surface,
wherein the internal surface of the cooling enclosure is spaced from the heater by plural support elements each providing plural openings circumferentially spaced from one another along each of the support elements that the openings and space between the heater and the internal surface of the cooling enclosure define an annular conductance channel.

2. The vacuum deposition source of claim 1, wherein the crucible comprises pyrolytic boron nitride.

3. The vacuum deposition source of claim 1, wherein the crucible comprises a second conical portion.

4. The vacuum deposition source of claim 1, comprising a crucible support assembly comprising a support flange removably mounted to the base flange and a crucible support cup supported relative to the support flange, wherein an end of the crucible opposite the effusion orifice is supported by the support cup.

5. The vacuum deposition source of claim 4, wherein the crucible support assembly comprises an adjustment device configured to adjust the distance between the support flange and the support cup.

6. The vacuum deposition source of claim 1, comprising a heater support assembly having a support base operatively supported relative to the base flange and engaged with an end of the heater.

7. The vacuum deposition source of claim 6, wherein the heater support assembly comprises an adjustment device configured to adjust the distance between the base flange and the support base.

8. The vacuum deposition source of claim 1, comprising a liquid cooling enclosure operatively attached to the base flange at a first end of the liquid cooling enclosure and at least partially surrounding the crucible.

9. The vacuum deposition source of claim 8, comprising a conical cover positioned at a second end of the liquid cooling enclosure opposite the first end of the liquid cooling enclosure, the conical cover comprising an opening at an end of the conical cover positioned relative to an end of the crucible and an end of the conical portion of the heater.

10. The vacuum deposition source of claim 9, wherein the conical cover comprises pyrolytic boron nitride.

11. The vacuum deposition source of claim 9, comprising plural layers of conical heat shielding material positioned adjacent to the conical cover.

12. The vacuum deposition source of claim 9, wherein the end of the conical portion of the heater extends past the end of the conical cover.

13. The vacuum deposition source of claim 9, wherein the end of the crucible extends past the end of the conical portion of the heater.

14. A vacuum deposition source comprising:
a base flange configured to mount the vacuum deposition source to a vacuum chamber;
a crucible operatively supported relative to the base flange and configured to hold vacuum deposition material, the crucible comprising a cylindrical body portion, a conical portion, and an effusion orifice;
a heater operatively supported relative to the base flange and at least partially surrounding the crucible, the heater comprising a cylindrical body portion configured and positioned to provide thermal radiation to at least a portion of the cylindrical body portion of the crucible and a conical portion configured and positioned to provide thermal radiation to at least a portion of the conical portion of the crucible, the heater comprising a layered structure comprising a pyrolytic graphite electrically resistive layer positioned between pyrolytic boron nitride electrically insulative layers;
a liquid cooling enclosure operatively attached to the base flange at a first end of the liquid cooling enclosure and extending along at least partially surrounding the crucible, the cooling enclosure having an internal surface; and
a conical cover positioned at a second end of the liquid cooling enclosure opposite the first end of the cooling enclosure, the conical cover comprising an opening positioned relative to the effusion orifice of the crucible;
wherein the internal surface of the liquid cooling enclosure is spaced from the heater by plural support elements each providing plural openings circumferentially spaced from one another along each of the support elements so that the openings and space between the heater and the internal surface of the cooling enclosure define an annular conductance channel.

15. The vacuum deposition source of claim 14, wherein the heater comprises a first heating zone associated with the cylindrical body portion of the heater and a second heating zone associated with the conical portion of the heater.

16. The vacuum deposition source of claim 14, comprising a crucible support assembly comprising a support flange removably mounted to the base flange and a crucible support cup supported relative to the support flange, wherein an end of the crucible opposite the effusion orifice is supported by the support cup and wherein the crucible support assembly comprises an adjustment device configured to adjust the distance between the support flange and the support cup.

17. The vacuum deposition source of claim 14, comprising a heater support assembly having a support base operatively supported relative to the base flange and engaged with an end of the heater and an adjustment device configured to adjust the distance between the base flange and the support base.

18. The vacuum deposition source of claim 14, comprising a cylindrical heat shield assembly at least partially surrounding the heater.

19. A vacuum deposition source comprising:
a base flange configured to mount the vacuum deposition source to a vacuum chamber;
a crucible support assembly comprising a support flange removably mounted to the base flange and a crucible support cup supported relative to the support flange;
a crucible operatively supported by the support cup of the crucible support assembly and configured to hold vacuum deposition material, the crucible comprising a cylindrical body portion, a conical portion, and an effusion orifice; and
a heater operatively supported relative to the base flange independent of the mounting of the crucible support flange to the base flange and at least partially surrounding the crucible, the heater comprising a cylindrical body portion configured and positioned to provide thermal radiation to at least a portion of the cylindrical body portion of the crucible, the heater being operatively supported relative to the base flange by a heater support assembly having a support base operatively supported relative to the base flange and engaged with an end of the heater, wherein the heater support assembly comprises an adjustment device configured to adjust the distance between the base flange and the support base of the heater support assembly and for moving the heater relative to the crucible; a cooling enclosure operatively attached to the base flange at a first end of the liquid cooling enclosure extending along and at least partially surrounding the crucible, the liquid cooling enclosure having an internal surface;
wherein the internal surface of the cooling enclosure is spaced from the heater by plural support elements each providing plural openings circumferentially spaced from one another along each of the support elements so that the openings and space between the heater and the internal surface of the cooling enclosure define an annular conductance channel.

20. The vacuum deposition source of claim 19, wherein the crucible support assembly comprises an adjustment device configured to adjust the distance between the support flange and the support cup, independently of adjustment of the heater relative to the base flange.

21. The vacuum deposition source of claim 19, comprising a conical cover positioned at a second end of the liquid cooling enclosure opposite the first end of the liquid cooling enclosure, the conical cover comprising an opening at an end of the conical cover positioned relative to an end of the crucible and an end of the conical portion of the heater.

* * * * *